(12) United States Patent
Tsuji

(10) Patent No.: US 11,915,925 B2
(45) Date of Patent: Feb. 27, 2024

(54) SEMICONDUCTOR DEVICE MANUFACTURING METHOD

(71) Applicant: DAICEL CORPORATION, Osaka (JP)

(72) Inventor: Naoko Tsuji, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 244 days.

(21) Appl. No.: 17/286,725

(22) PCT Filed: Oct. 18, 2019

(86) PCT No.: PCT/JP2019/041198
§ 371 (c)(1),
(2) Date: Apr. 19, 2021

(87) PCT Pub. No.: WO2020/085258
PCT Pub. Date: Apr. 30, 2020

(65) Prior Publication Data
US 2021/0391165 A1  Dec. 16, 2021

(30) Foreign Application Priority Data

Oct. 23, 2018 (JP) .................. 2018-199014

(51) Int. Cl.
*H01L 21/02* (2006.01)
*H01L 21/78* (2006.01)

(52) U.S. Cl.
CPC ...... *H01L 21/022* (2013.01); *H01L 21/02126* (2013.01); *H01L 21/02312* (2013.01); *H01L 21/02345* (2013.01); *H01L 21/78* (2013.01)

(58) Field of Classification Search
CPC ............. H01L 21/022; H01L 21/02126; H01L 21/02312; H01L 21/02345; H01L 21/78;
(Continued)

(56) References Cited

U.S. PATENT DOCUMENTS 7,494,845 B2 * 2/2009 Hwang ................ H01L 23/481
438/455
8,017,439 B2 * 9/2011 Takahashi ................ C09J 5/06
438/459

(Continued)

FOREIGN PATENT DOCUMENTS

JP   2013-77767 A   4/2013
JP   2015-119110 A  6/2015

(Continued)

OTHER PUBLICATIONS

Korean Ofice Action dated Jul. 25, 2022 for Application No. 10-2021-7014956.

(Continued)

*Primary Examiner* — Vu A Vu
(74) *Attorney, Agent, or Firm* — Birch, Stewart, Kolasch & Birch, LLP

(57) ABSTRACT

An object of the present invention is to provide a technique suitable for achieving low wiring resistance and reducing a variation in the resistance value between semiconductor elements to be multilayered in a method of manufacturing a semiconductor device in which the semiconductor elements are multilayered through laminating semiconductor wafers via an adhesive layer. The method of the present invention includes first to third processes. In the first process, a wafer laminate Y is prepared, the wafer laminate Y having a laminated structure including a wafer 3, wafers 1T with a thickness from 1 to 20 um, and an adhesive layer 4 with a thickness from 0.5 to 4.5 μm interposed between a main surface 3a of the wafer 3 and a back surface 1b of the wafer 1T. In the second process, holes extending from the main surface 1a of the wafer 1T and reaching a wiring pattern of the wafer 3 are formed by a predetermined etching treatment. In the third process, the holes are filled with a conductive material to form through electrodes. The adhe- (Continued)

sive layer 4 has an etching rate of 1 to 2 μm/min in dry etching performed using an etching gas containing $CF_4$, $O_2$, and Ar at a volume ratio of 100:400:200 under predetermined conditions.

6 Claims, 10 Drawing Sheets

(58) Field of Classification Search
CPC . H01L 2221/68327; H01L 2221/68381; H01L 2221/68386; H01L 2224/32145; H01L 2924/3511; H01L 21/02057; H01L 21/30655; H01L 21/31116; H01L 21/31138; H01L 21/6835; H01L 21/76898; H01L 25/50; H01L 21/02; H01L 23/5226; H01L 25/0657; H01L 25/074; H01L 25/18; H01L 2221/68359; H01L 2225/06541; C08G 59/306; C08G 59/3281; C08G 59/687; C09J 163/00; C09J 183/04; C09J 201/00; C09J 183/06; C09J 2203/326; C09J 2301/312; C09J 2301/416; C09J 2301/502
USPC ......................................................... 438/458
See application file for complete search history.

(56) References Cited

U.S. PATENT DOCUMENTS

| | | | |
|---|---|---|---|
| 8,076,788 B2* | 12/2011 | Haba | H01L 24/97 257/777 |
| 8,415,202 B2* | 4/2013 | Ohba | B81C 1/00238 438/109 |
| 8,415,235 B2* | 4/2013 | Kawata | C09J 175/16 438/464 |
| 8,415,807 B2* | 4/2013 | Wang | H01L 25/50 257/777 |
| 9,070,729 B2* | 6/2015 | Ji | H01L 21/02013 |
| 9,391,049 B2* | 7/2016 | Lin | H01L 25/50 |
| 9,406,748 B1* | 8/2016 | Balakrishnan | H01L 29/66439 |
| 9,543,257 B2* | 1/2017 | Tsai | H01L 23/585 |
| 9,640,531 B1* | 5/2017 | Or-Bach | H01L 27/1203 |
| 9,960,080 B2* | 5/2018 | Beyne | H01L 21/31116 |
| 10,014,292 B2* | 7/2018 | Or-Bach | H01L 25/117 |
| 10,163,864 B1 | 12/2018 | England | |
| 10,947,425 B2 | 3/2021 | Koduma et al. | |
| 10,964,576 B2* | 3/2021 | Yamamoto | H01L 21/67092 |
| 11,069,560 B2* | 7/2021 | Konishi | H01L 21/2007 |
| 2003/0157748 A1 | 8/2003 | Kim et al. | |
| 2006/0102993 A1 | 5/2006 | Tsai et al. | |
| 2010/0109164 A1 | 5/2010 | Kang et al. | |
| 2011/0165730 A1 | 7/2011 | Ohba | |
| 2012/0025362 A1 | 2/2012 | Chandrasekaran et al. | |
| 2013/0234339 A1 | 9/2013 | Higashi et al. | |
| 2014/0183728 A1 | 7/2014 | Han et al. | |
| 2016/0163579 A1 | 6/2016 | Nakamura et al. | |
| 2017/0372935 A1 | 12/2017 | Val | |
| 2018/0047619 A1 | 2/2018 | Lehnert et al. | |
| 2019/0119534 A1 | 4/2019 | Koduma et al. | |
| 2019/0206844 A1 | 7/2019 | Lee | |
| 2019/0311964 A1 | 10/2019 | Nakamura et al. | |
| 2020/0062996 A1* | 2/2020 | Kikuchi | B32B 27/28 |

FOREIGN PATENT DOCUMENTS

| | | |
|---|---|---|
| JP | 2016-4835 A | 1/2016 |
| JP | 2016-178182 A | 10/2016 |
| JP | 2017-132919 A | 8/2017 |
| KR | 10-2010-0066942 A | 6/2010 |
| KR | 10-2017-0140985 A | 12/2017 |
| WO | WO 2010/032729 A1 | 3/2010 |
| WO | WO 2016/204115 A1 | 12/2016 |
| WO | WO 2017/061416 A1 | 4/2017 |

OTHER PUBLICATIONS

U.S. Office Action dated Sep. 30, 2022 for U.S. Appl. No. 17/286,738.
U.S. Office Action for U.S. Appl. No. 17/287,922, dated Apr. 27, 2023.
Written Opinion of the International Searching Authority and International Search Report dated Dec. 3, 2019, for International Application No. PCT/JP2019/041196, with English translations.
Written Opinion of the International Searching Authority and International Search Report dated Jan. 7, 2020, for International Application No. PCT/JP2019/041197, with English translations.
Written Opinion of the International Searching Authority and International Search Report dated Jan. 7, 2020, for International Application No. PCT/JP2019/041198, with English translations.
Written Opinion of the International Searching Authority and International Search Report dated Jan. 7, 2020, for International Application No. PCT/JP2019/041202, with English translation.
U.S. Notice of Allowance for U.S. Appl. No. 17/286,738, dated Feb. 17, 2023.
Korean Office Action dated May 30, 2023 for Application No. 10-2021-7014991.
U.S. Notice of Allowance for U.S. Appl. No. 17/287,922, dated Sep. 18, 2023.
U.S. Office Action for U.S. Appl. No. 17/287,187, dated Oct. 20, 2023.

* cited by examiner (a)

(b)

(c)

SEMICONDUCTOR DEVICE MANUFACTURING METHOD

TECHNICAL FIELD

The present invention relates to a method of manufacturing a semiconductor device having a laminated structure including a plurality of semiconductor elements. The present application claims priority to the Japanese Patent Application No. 2018-199014 filed in Japan on Oct. 23, 2018, the contents of which are incorporated herein.

BACKGROUND ART

In recent years, primarily for the purpose of further increasing the density of semiconductor devices, technology for manufacturing semiconductor devices having a three-dimensional structure in which a plurality of semiconductor chips or semiconductor elements is integrated in their thickness direction has been developed. One of such a technology widely known is a wafer-on-wafer (WOW) process. In the WOW process, a structure is such that a predetermined number of semiconductor wafers, within which a plurality of semiconductor elements is fabricated for each of the semiconductor wafers. In such a structure, the semiconductor elements are arranged in multilayers in their thickness direction, and the wafer laminate is divided into individual semiconductor devices through dicing. Technology relating to such a WOW process is described, for example, in Patent Documents 1 and 2 listed below.

CITATION LIST

Patent Document

Patent Document 1: JP 2016-004835 A
Patent Document 2: JP 2016-178162 A

SUMMARY OF INVENTION

Technical Problem

In the WOW process, a via, that is through electrode for electrically connecting the semiconductor elements formed in different wafers in the wafer laminate, the via or through electrode penetrating the wafers. The through electrode is formed, for example, by forming a hole penetrating the inside of the wafers in their thickness direction through reactive ion etching and filling the hole with a conductive material.

On the other hand, use of an adhesive is conceivable for bonding the wafers to be multilayered. In addition, to form a through electrode in an upper wafer laminated on a wafer via an adhesive layer, the through electrode electrically connected to a semiconductor element of a lower wafer, the hole needs to be formed by reactive ion etching in the hall forming to penetrate the upper wafer and the adhesive layer lying immediately under the upper wafer. Such a hole is filled with a conductive material.

However, through reactive ion etching on the adhesive layer, side etching is likely to proceed on the surface of the adhesive layer, the surface where the hole is exposed, likely forming a concave portion, that is, a bowing shape. Such a bowing shape may cause the formation of a leakage current path from the through electrode to the wafer. The formation of the leakage current circuit may increase wiring resistance and lead to a variation in the resistance value between semiconductor elements to be electrically connected by the through electrode.

As a result of diligent research, the present inventor discovered that a laminate in which wafers with a specific thickness are laminated using a specific adhesive has a fast etching rate in the hole forming step and can reduce side etching of the adhesive to prevent the bowing shape, and thus the present inventor completed the present invention.

The present invention was conceived under the circumstances as described above, and an object of the present invention is to provide a technique suitable for achieving low wiring resistance and reducing a variation in the resistance value between semiconductor elements to be multi-layered in a method of manufacturing a semiconductor device in which the semiconductor elements are multilayered through laminating semiconductor wafers via an adhesive layer.

Solution to Problem

A method of manufacturing a semiconductor device, the method provided by the present invention, includes preparing, hole forming, and electrode forming as described below.

In the preparing step, a wafer laminate is prepared. The wafer laminate has a laminated structure including a first wafer having an element forming surface including a wiring pattern, a second wafer with a thickness of 1 to 20 μm having a main surface and a back surface opposite from the main surface, and an adhesive layer with a thickness from 0.5 to 4.5 μm interposed between the element forming surface of the first wafer and the back surface of the second wafer. The element forming surface refers to a surface on a side where a semiconductor element is fabricated in a wafer and what is called a rewiring layer is formed on the element. The main surface refers to a surface (element forming surface) on a side where a semiconductor element is fabricated in the wafer.

In the present method of manufacturing a semiconductor device, the preparing preferably includes the following: reinforced wafer forming, thinning, bonding, and removing. The reinforced wafer forming step is a process to form a reinforced wafer having a laminated structure including a second wafer having a main surface and a back surface opposite from the main surface, a supporting substrate, and a temporary adhesive layer located between the main surface side of the second wafer and the supporting substrate. The thinning step is a process to thin the second wafer in the reinforced wafer by grinding the second wafer from the back surface side of the second wafer. This forms a thinned wafer in a state of being supported by the supporting substrate. The second wafer is thinned to a thickness from 1 to 20 μm in the thinning step. The bonding step is a process to bond the element forming surface side of the first wafer to the back surface side of the second wafer of the reinforced wafer having undergone the thinning step via an adhesive for forming the adhesive layer. The present bonding step preferably includes a curing treatment to cure the adhesive at a temperature lower than a softening point of a polymer described later in the temporary adhesive layer. In such a bonding step, for example, the adhesive is coated on one or both surfaces to be bonded (the element forming surface of the first wafer or the back surface of the second wafer), the surfaces to be bonded are affixed via the adhesive, and the adhesive is cured after the affixing. In addition, in the bonding step, prior to the coating of the adhesive, one or both of the surfaces to be bonded may be treated with a silane coupling agent. The removing step is a process to remove the supporting substrate by releasing a temporary adhesion by the temporary adhesive layer located between the supporting substrate and the second wafer in the reinforced wafer having undergone the bonding. The present removing step preferably includes a softening treatment to soften the temporary adhesive layer at a temperature higher than the softening point of the polymer described later in the temporary adhesive layer. The wafer laminate is formed through these preparing steps.

In addition, in the present method of manufacturing a semiconductor device, the preparing preferably further includes the following: additional reinforced wafer forming, additional thinning, additional bonding, and removing. The additional reinforced wafer forming step is a process to form at least one additional reinforced wafer having a laminated structure including a second wafer having a main surface and a back surface opposite from the main surface, a supporting substrate, and a temporary adhesive layer located between the main surface side of the second wafer and the supporting substrate. The additional thinning step is a process to thin the second wafer in each additional reinforced wafer by grinding the second wafer from the back surface side of the second wafer. The additional bonding step is at least one process to bond the back surface side of the second wafer in the additional reinforced wafer having undergone the additional thinning step to the main surface side of the second wafer on the first wafer via the adhesive for forming the adhesive layer. The removing step is at least one process performed for each of the additional bonding to remove the supporting substrate by releasing the temporary adhesion by the temporary adhesive layer located between the supporting substrate and the second wafer in the additional reinforced wafer. The present additional bonding step preferably includes a curing treatment to cure the adhesive at a temperature lower than the softening point of the polymer described later in the temporary adhesive layer. In such an additional bonding step, for example, the adhesive is coated on one or both surfaces to be bonded (the main surface of one thinned second wafer, the back surface of the other thinned second wafer), the surfaces to be bonded are affixed via the adhesive, and the adhesive is cured after the affixing. In addition, in the additional bonding, prior to the coating of the adhesive, one or both of the surfaces to be bonded may be treated with a silane coupling agent. Then, in the removing step after the additional bonding step, the temporary adhesion by the temporary adhesive layer located between the supporting substrate and the thinned second wafer in the additional reinforced wafer is released to remove the supporting substrate. The present removing step preferably includes a softening treatment to soften the temporary adhesive layer at a temperature higher than the softening point of the polymer described later in the temporary adhesive layer. The configuration as described above is suitable for further multilayering thin wafers via adhesive bonding while avoiding wafer damage.

In the hole forming, a hole is formed by an etching treatment from the second wafer side via a mask pattern masking a portion of the main surface side of the second wafer in the wafer laminate, the hole penetrating the second wafer and the adhesive layer and reaching the wiring pattern in the first wafer. In the etching treatment, reactive ion etching is performed. In addition, the portion facing the hole in the wiring pattern forms a bottom surface of the hole.

In the electrode forming step, a through electrode is formed by filling the hole with a conductive material, the hole formed in the hole forming. The through electrode formed is structurally and electrically connected to the wiring pattern of the element forming surface of the first wafer. This through electrode is to electrically connect the semiconductor element derived from the second wafer and the semiconductor element derived from the first wafer in a semiconductor device to be manufactured. Such a configuration allows the semiconductor elements to be appropriately electrically connected at short distances in a semiconductor device to be manufactured. Thus, the configuration is suitable for achieving an efficient digital signal processing, for reducing attenuation of the high-frequency signal, and also for reducing power consumption in a semiconductor device to be manufactured. A barrier layer is preferably formed on the hole wall surface prior to the electrode forming step.

In addition, the conductive material filling technique in the electrode forming step is preferably an electroplating method.

The hole forming step and the electrode forming step are preferably performed on a second wafer and an adhesive layer under the second wafer each time the second wafer is laminated.

In addition, the hole forming step and the electrode forming step are collectively performed in a wafer laminate including the first wafer and a plurality of second wafers in a laminated structure.

The adhesive layer in the present method of manufacturing a semiconductor device has an etching rate from 1 to 2 μm/min in dry etching performed using an etching gas containing $CF_4$, $O_2$, and Ar at a volume ratio of 100:400:200 under conditions of an atmospheric pressure of 100 mTorr and a high frequency power supply power of 2000 W. Such a configuration is preferred to achieve low contact resistance between the conductive portion or the through electrode formed in the hole and the wiring pattern of the wafer element forming surface, and to reduce a variation in the resistance value. The thickness of the adhesive layer is from 0.5 to 4.5 μm. Such a configuration is suitable for shortening the conductive portion or the through electrode formed in the present method and thus is suitable for reducing the resistance of the entire conductive path or the entire wiring between semiconductor elements electrically connected via the through electrode. The thickness of the second wafer is from 1 to 20 μm. Such a configuration is suitable for shortening the conductive portion or the through electrode formed in the present method and thus is suitable for reducing the resistance of the entire conductive path or the entire wiring between semiconductor elements electrically connected via the through electrode.

In the present method of manufacturing a semiconductor device, the adhesive for forming the adhesive layer preferably contains a polymerizable group-containing polyorganosilsesquioxane. The polymerizable group-containing polyorganosilsesquioxane is suitable for achieving a relatively low polymerization temperature or curing temperature of, for example, approximately 30 to 200° C. and is suitable for achieving high heat resistance after curing. Thus, the wafer-to-wafer adhesive bonding with the adhesive containing the polymerizable group-containing polyorganosilsesquioxane is suitable for achieving high heat resistance in an adhesive layer to be formed between the wafers as well as achieving lower curing temperature for forming the adhesive layer and thus preventing damages to the elements in the wafer as an adherend.

The temporary adhesive layer is for achieving a temporary adhesion between the supporting substrate and the wafer, and a temporary adhesive for forming the temporary adhesive layer preferably contains a polyvalent vinyl ether compound, a compound having two or more hydroxy groups or carboxy groups capable of forming an acetal bond by reacting with a vinyl ether group of the polyvalent vinyl ether compound and thus capable of forming a polymer with the polyvalent vinyl ether compound, and a thermoplastic resin. The temporary adhesive thus configured is suitable, in the form of the temporary adhesive layer formed by solidification between the supporting substrate and the wafer, for achieving a relatively high softening temperature of, for example, approximately 130 to 250° C. while ensuring high adhesive strength that can withstand the grinding or the like in the thinning step of the wafer.

The temporary adhesive layer described above in the reinforced wafer to be subjected to the bonding step is thus suitable for achieving a relatively high softening temperature, and the adhesive used in the above bonding step is suitable for achieving a relatively low curing temperature and high heat resistance after curing as described above. This composite configuration is suitable for performing the bonding step and performing the subsequent removing step both in combination. That is, the composite configuration is suitable for performing the bonding step at a relatively low temperature condition to achieve a good adhesive bonding of the thinned second wafer to the base wafer while maintaining the temporary adhesion of the supporting substrate and the thinned second wafer in the reinforced wafer as well as for performing the subsequent removing at a relatively high temperature condition to soften the temporary adhesive layer to remove the supporting substrate from the thinned second wafer while maintaining the adhesive bonding between the base wafer and the thinned second wafer. The configuration of releasing the temporary adhesion by the temporary adhesive layer through softening the temporary adhesive layer in removing the supporting substrate from the thinned second wafer is suitable for avoiding or preventing a strong stress applied locally to the thinned second wafer to avoid damage to the wafer.

In the present method of manufacturing a semiconductor device, as described above, the through electrode for electrically connecting semiconductor elements is structurally and electrically connected to the wiring pattern on the element forming surface of the wafer. Such a bumpless structure is suitable for achieving a short conductive path between the semiconductor elements to be multilayered. In a WOW process known in the art, a bump electrode electrically connected to a through electrode penetrating a wafer may be formed on the wafer surface to achieve electrical connection between semiconductor elements in different wafers via the bump electrode. In contrast, in the method of manufacturing a semiconductor device according to an embodiment of the present invention, the through electrode is directly connected to a wiring pattern in a wafer, and a bumpless structure is formed in electrical connection between semiconductor elements in different wafers. Such a bumpless structure is suitable for achieving a short conductive path between the semiconductor elements to be multilayered as described above. The shorter the conductive path between the semiconductor elements to be multilayered is, the smaller the resistance of the conductive path or wiring between the elements tends to be.

The present method of manufacturing a semiconductor device preferably further includes thinning the first wafer by grinding on the back surface side in the first wafer. The present thinning step allows the base wafer to be thinned to a predetermined thickness. Such a configuration is suitable for reducing the thickness of a semiconductor device to be manufactured.

DESCRIPTION OF EMBODIMENTS

FIG. 1 to FIG. 10 illustrate a method of manufacturing a semiconductor device according to an embodiment of the present invention. This manufacturing method is a method of manufacturing a semiconductor device having a three-dimensional structure in which semiconductor elements are integrated in their thickness direction, and FIG. 1 to FIG. 10 illustrate manufacturing processes in partial cross-sectional views.

Figure 1:
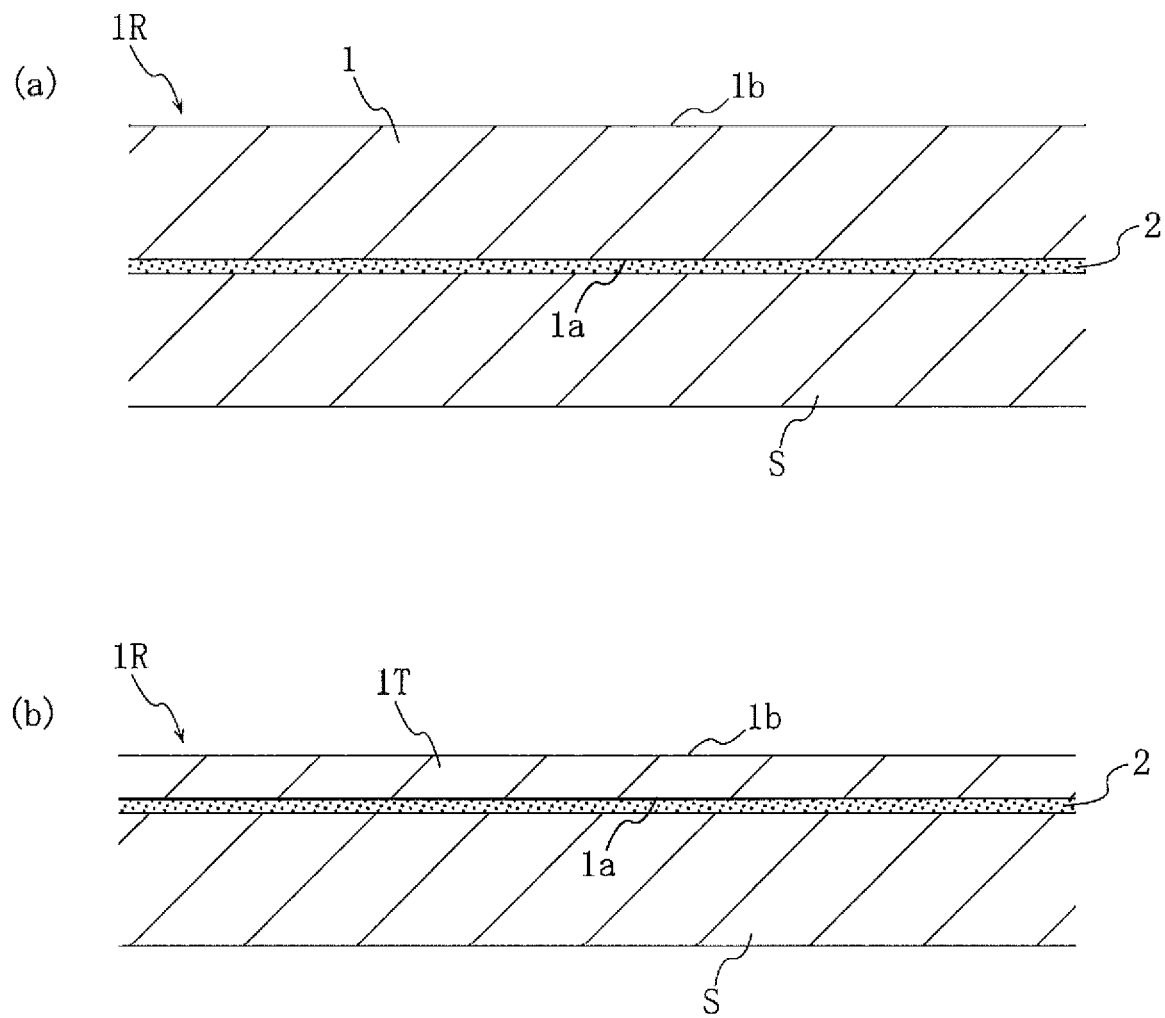
FIG. 1 illustrates some processes in a method of manufacturing a semiconductor device according to an embodiment of the present invention.
Figure 2:
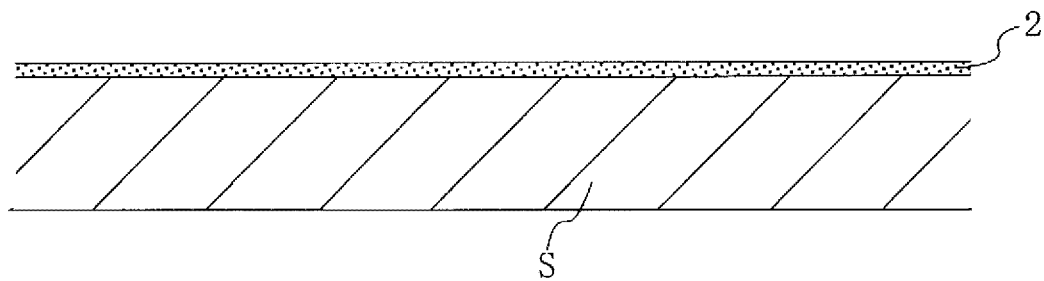
FIG. 2 illustrates some processes in a method of manufacturing a semiconductor device according to an embodiment of the present invention.
Figure 2:
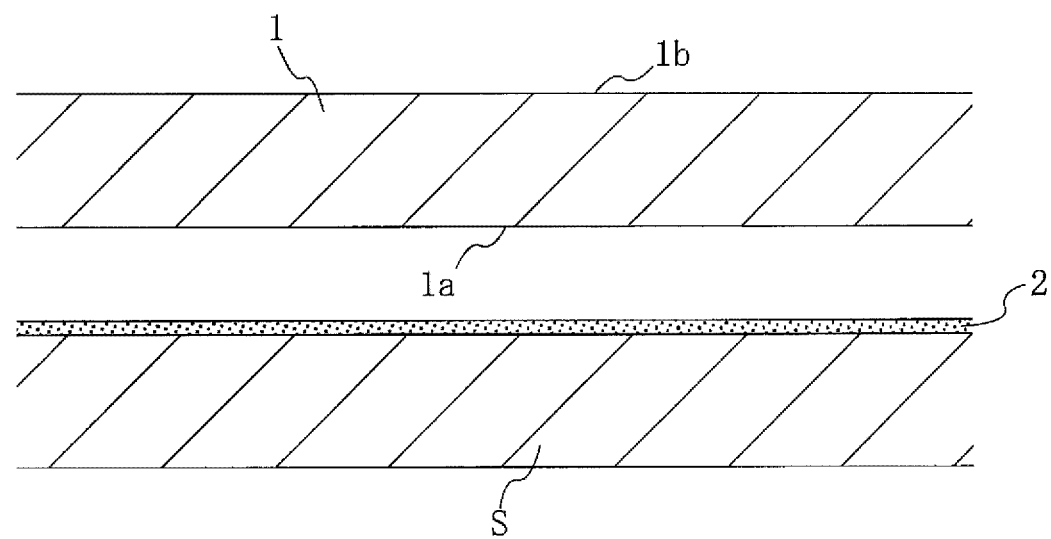
Figure 2:
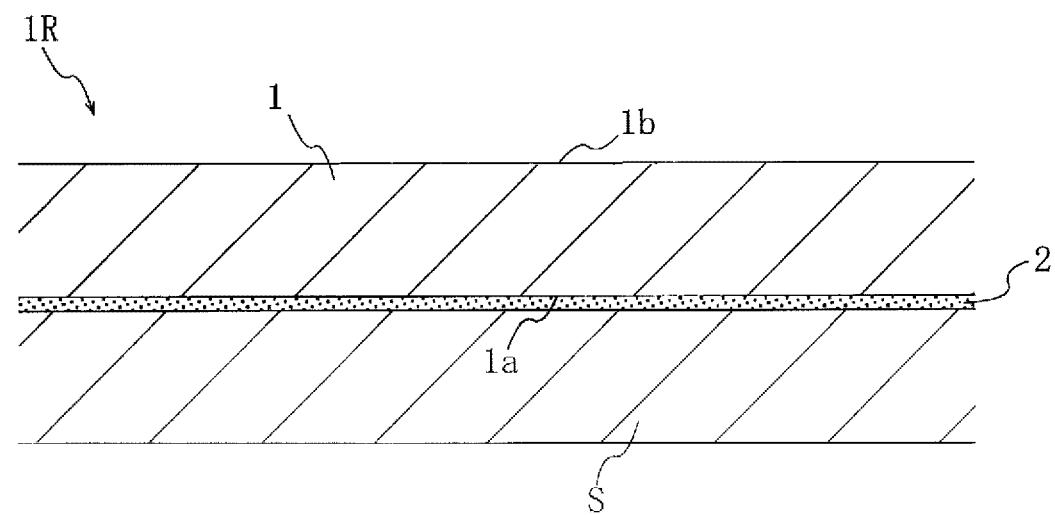

In the present method of manufacturing a semiconductor device, first, a reinforced wafer 1R as illustrated in FIG. 1(*a*) is prepared (preparing step). The reinforced wafer 1R has a laminated structure including a wafer 1 (second wafer), a supporting substrate S, and a temporary adhesive layer 2 between the wafer 1 and the supporting substrate S.

The wafer 1 is a wafer having a semiconductor wafer main body in which a semiconductor element can be fabricated, and has a man surface 1*a* and a back surface 1*b* opposite from the main surface 1*a*. In the present embodiment, the main surface of the wafer is a surface on the side on which a plurality of semiconductor elements (not illustrated) is formed (an element forming surface) in the wafer through transistor formation or the like. Each semiconductor element of the wafer 1 has, for example, a multi-layered wiring structure portion including an exposed electrode pad on a surface. Alternatively, the wafer 1 may be a wafer in which various semiconductor elements are already fabricated on the side of the element forming surface 1*a*, and a wiring structure including a wiring pattern necessary for the semiconductor elements is subsequently formed on the element forming surface 1a. Examples of a constituent material for forming the semiconductor wafer main body of the wafer 1 include silicon (Si), germanium (Ge), silicon carbide (SiC), gallium arsenide (GaAs), gallium nitride (GaN), and indium phosphide (InP). The thickness of such a wafer 1 is preferably not greater than 1000 μm, more preferably not greater than 900 μm, and more preferably not greater than 800 μm from the perspective of reducing the grinding time in grinding described later. In addition, the thickness of the wafer 1 is, for example, not less than 500 μm.

The supporting substrate S in the reinforced wafer 1R is for reinforcing the wafer 1 to be thinned through thinning described below. Examples of the supporting substrate S include silicon wafers and glass wafers. From the perspective of ensuring a function as a reinforcing element, the thickness of the supporting substrate S is preferably not less than 300 μm, more preferably not less than 500 μm, and more preferably not less than 700 μm. In addition, the thickness of the supporting substrate S is, for example, not greater than 800 μm. Such a supporting substrate S is bonded to the side of the man surface 1a of the wafer 1 via the temporary adhesive layer 2.

The temporary adhesive layer 2 is for achieving a temporary adhesion between the wafer 1 and the supporting substrate S, the temporary adhesion that can be subsequently released. The temporary adhesive for forming such a temporary adhesive layer 2 contains at least a polyvalent vinyl ether compound (A), a compound (B) having two or more hydroxy groups or carboxy groups that are capable of forming an acetal bond by reacting with a vinyl ether group of the polyvalent vinyl ether compound (A) so as to form a polymer with the polyvalent vinyl ether compound (A), and a thermoplastic resin (C). Each component in the temporary adhesive is as specifically described later.

Such reinforced wafer 1R thus configured can be produced, for example, through processes as follows. First, as illustrated in FIG. 2(a), the temporary adhesive layer 2 is formed on the supporting substrate S. Specifically, a temporary adhesive for forming the temporary adhesive layer 2 is coated on the supporting substrate S, for example, by spin coating to form a temporary adhesive coating. The coating is dried by heating, and the temporary adhesive layer 2 can be formed. The temperature of the heating is, for example, from 100 to 300° C., and may be constant or may be changed stepwise. The heating time is, for example, from 30 seconds to 30 minutes. Next, as illustrated in FIG. 2(b) and FIG. 2(c), the supporting substrate S and the wafer 1 are bonded via the temporary adhesive layer 2. As described above, the wafer 1 has the man surface 1a and the back surface 1b opposite from the man surface 1a. In the present preparing, for example, the supporting substrate S and the wafer 1 are affixed via the temporary adhesive layer 2 under pressure, then the temporary adhesive layer 2 is solidified through heating to form a polymer having a softening point in a high-temperature range, and the supporting substrate S and the wafer 1 are adhered with the temporary adhesive layer 2. In the affixing, the pressure is, for example, from 300 to 5000 g/cm², and the temperature is, for example, from 30 to 200° C. In addition, in the bonding with the temporary adhesive layer 2, the heating temperature is, for example, from 100 to 300° C. and preferably from 100 to 250° C., and the heating time is, for example, from 30 seconds to 30 minutes and preferably from 3 to 12 minutes. The heating temperature may be constant or may be changed stepwise. As described above, the reinforced wafer 1R having a laminated structure including the wafer 1, the supporting substrate S, and the temporary adhesive layer 2 between the wafer 1 and the supporting substrate S.

The polyhydric vinyl ether compound (A) described above in the temporary adhesive is a compound having two or more vinyl ether groups in a molecule and is represented, for example, by Formula (a) below.

[Chem. 1]

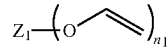

(a)

In Formula (a), $Z_1$ represents a group in which $n_1$ hydrogen atoms are removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group. In addition, in Formula (a), $n_1$ represents an integer of 2 or greater, for example, an integer from 2 to 5, and preferably an integer of 2 or 3.

Among the groups in which $n_1$ hydrogen atoms are removed from a structural formula of a saturated or unsaturated aliphatic hydrocarbon, examples of the group in which two hydrogen atoms are removed from a structural formula of a saturated or unsaturated aliphatic hydrocarbon may include linear or branched alkylene groups, such as a methylene group, an ethylene group, a propylene group, a trimethylene group, a tetramethylene group, a pentamethylene group, a hexamethylene groups, an octamethylene group, a decamethylene group, and a dodecamethylene group; and linear or branched alkenylene groups, such as a vinylene group, a 1-propenylene group, and 3-methyl-2-butenylene group. The alkylene group has, for example, from 1 to 20 carbon atoms and preferably has from 1 to 10 carbon atoms. The alkenylene group has, for example, from 2 to 20 carbon atoms and preferably has from 2 to 10 carbon atoms. Examples of the group in which three or more hydrogen atoms are removed from a structural formula of a saturated or unsaturated aliphatic hydrocarbon may include groups in which one or more hydrogen atoms are further removed from the structural formula of any of these groups exemplified.

Among the groups in which $n_1$ hydrogen atoms are removed from a structural formula of a saturated or unsaturated alicyclic hydrocarbon, examples of the group in which two hydrogen atoms are removed from a structural formula of a saturated or unsaturated alicyclic hydrocarbon may include cycloalkylene groups of a 3- to 15-membered ring, membered ring, such as a 1,2-cyclopentylene group, a 1,3-cyclopentylene group, a 1,2-cyclohexylene group, a 1,3-cyclohexylene group, and a 1,4-cyclohexylene group; cycloalkenylene groups of a 3- to 15-membered ring, such as a cyclopentenylene group and a cyclohexenylene group; cycloalkylidene groups of a 3- to 15-membered ring, such as a cyclopentylidene group and a cyclohexylidene group; and divalent bridged cyclic hydrocarbon groups of a 4- to 15-membered ring, such as an adamantanediyl group, a norbornanediyl group, a norbornenediyl group, an isobornanediyl group, a tricyclodecanediyl group, a tricycloundecanediyl group, and a tetracyclododecanediyl group. Examples of the group in which three or more hydrogen atoms are removed from a structural formula of a saturated or unsaturated alicyclic hydrocarbon may include groups in which one or more hydrogen atoms are further removed from the structural formula of any of these groups exemplified.

Examples of the aromatic hydrocarbon may include benzene, naphthalene, and anthracene.

The heterocyclic compound includes aromatic heterocyclic compounds and non-aromatic heterocyclic compounds. Examples of such heterocyclic compounds may include heterocyclic compounds containing an oxygen atom as a heteroatom (e.g., 5-membered rings, such as furan, tetrahydrofuran, oxazole, isooxazole, and γ-butyrolactone; 6-membered rings, such as 4-oxo-4H-pyran, tetrahydropyran, and morpholine; fused rings, such as benzofuran, isobenzofuran, 4-oxo-4H-chromene, chroman, and isochroman; and bridged rings, such as 3-oxatricyclo[4.3.1.1$^{4,8}$]undecane-2-one and 3-oxatricyclo[4.2.1.0$^{4,8}$]nonane-2-one), heterocyclic compounds containing a sulfur atom as a heteroatom (e.g., 5-membered rings, such as thiophene, thiazole, isothiazole, and thiadiazole; 6-membered rings, such as 4-oxo-4H-thiopyran; and fused rings, such as benzothiophene), and heterocyclic compounds containing a nitrogen atom as a heteroatom (e.g., 5-membered rings, such as pyrrole, pyrrolidine, pyrazole, imidazole, and triazole; 6-membered rings, such as pyridine, pyridazine, pyrimidine, pyrazine, piperidine, and piperazine; and fused rings, such as indole, indoline, quinoline, acridine, naphthyridine, quinazoline, and purine).

Examples of the linking group may include divalent to tetravalent hydrocarbon groups, a carbonyl group (—CO—), an ether bond (—O—), a sulfide bond (—S—), an ester bond (—COO—), an amide bond (—CONH—), a carbonate bond (—OCOO—), a urethane bond (—NHCOO—), an —NR— bond (R represents a hydrogen atom, an alkyl group, or an acyl group), and groups in which a plurality of these groups are linked. Among the divalent to tetravalent hydrocarbon groups, examples of the divalent hydrocarbon group may include linear or branched alkylene groups having from 1 to 10 carbon atoms, such as a methylene group, a methylmethylene group, a dimethylmethylene group, an ethylene group, a propylene group, and a trimethylene group; and alicyclic hydrocarbon groups having from 4 to 15 carbon atoms (in particular, cycloalkylene groups), such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group. Examples of the trivalent hydrocarbon group may include a group in which one hydrogen atom is removed from a structural formula of the divalent hydrocarbon group. Examples of the tetravalent hydrocarbon group may include a group in which two hydrogen atoms are removed from a structural formula of the divalent hydrocarbon group.

$Z_1$ may have one or two or more substituents. Examples of the substituent may include alkyl groups, cycloalkyl groups, alkenyl groups, cycloalkenyl groups, aryl groups, hydroxy groups, carboxy groups, nitro groups, amino groups, mercapto groups, halogen atoms, $C_{2-10}$ hydrocarbon groups substituted with a halogen atom, hydrocarbon groups containing a functional group containing a heteroatom (such as oxygen or sulfur), and a group in which two or more of these groups are bonded. Examples of the alkyl groups include $C_{1-4}$ alkyl groups, such as a methyl group and an ethyl group. Examples of the cycloalkyl groups include $C_{3-10}$ cycloalkyl groups.

Examples of the alkenyl groups include $C_{2-10}$ alkenyl groups, such as a vinyl group. Examples of the cycloalkenyl groups include $C_{3-10}$ cycloalkenyl groups. Examples of the aryl groups include $C_{6-15}$ aryl groups, such as a phenyl group and a naphthyl group. Examples of the hydrocarbon groups containing a heteroatom-containing functional group include $C_{1-4}$ alkoxy groups and $C_{2-6}$ acyloxy groups.

Specific examples of the polyvalent vinyl ether compound (A) may include 1,4-butanediol divinyl ether, diethylene glycol divinyl ether, and triethylene glycol divinyl ether, and compounds represented by Formulas (a-1) to (a-21) below.

[Chem. 2]

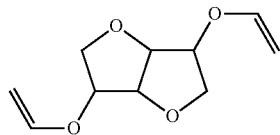
(a-1)

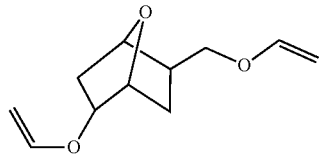
(a-2)

(a-3)

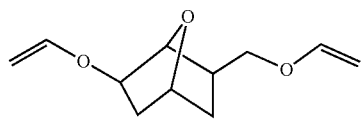
(a-4)

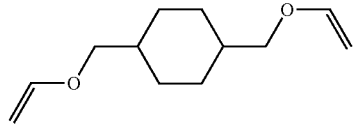
(a-5)

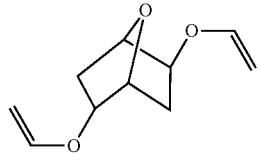
(a-6)

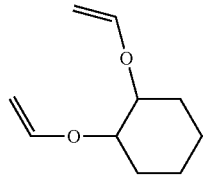
(a-7)

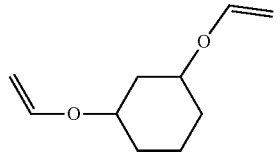
(a-8)

(a-9) 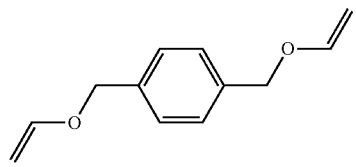
(a-10) 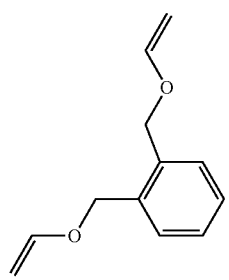
(a-11) 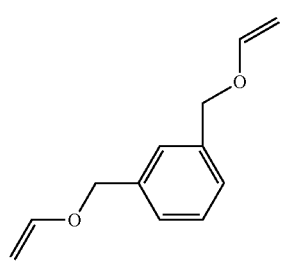
[Chem. 3]
(a-12) 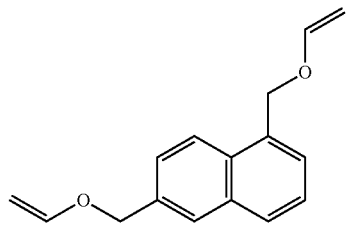
(a-13)
(a-14)
(a-15) 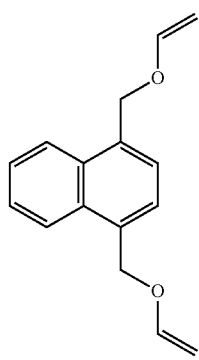
(a-16) 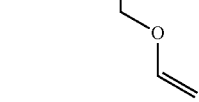
(a-17) 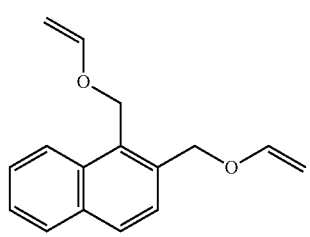
(a-18)
(a-19) 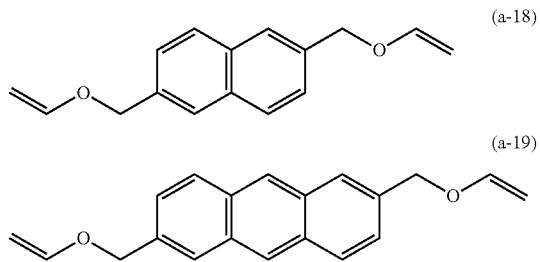
(a-20) 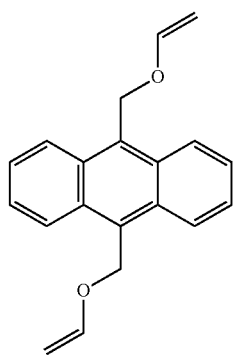

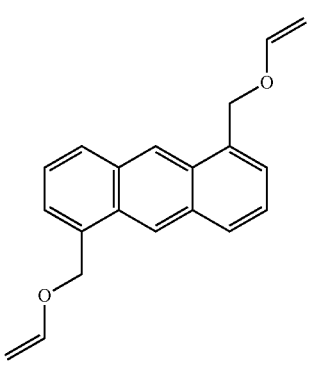

(a-21)

From the perspective of forming a polymer having a high softening point in the temporary adhesive described above, $Z_1$ above in the polyvalent vinyl ether compound (A) is preferably a group in which $n_1$ hydrogen atoms are removed from a structural formula of a saturated or unsaturated aliphatic hydrocarbon, or a bonded body in which a plurality of the hydrocarbons is bonded via a linking group; more preferably a group in which $n_1$ hydrogen atoms are removed from a structural formula of a saturated aliphatic hydrocarbon or a bonded body in which a plurality of the hydrocarbons is bonded via a linking group; and more preferably a group in which ni hydrogen atoms are removed from a structural formula of a linear alkylene group having from 1 to 20 carbon atoms, a branched alkylene group having from 2 to 20 carbon atoms, or a bonded body in which a plurality of the alkylene groups is bonded via a linking group.

[0040]

The polyvalent vinyl ether compound (A) is most preferably at least one compound selected from the group consisting of 1,4-butanediol divinyl ether, diethylene glycol divinyl ether, and triethylene glycol divinyl ether.

As described above, the compound (B) in the temporary adhesive is a compound having two or more hydroxy groups or carboxy groups that are capable of forming an acetal bond by reacting with a vinyl ether group of the polyvalent vinyl ether compound (A) so as to form a polymer with the polyvalent vinyl ether compound (A), and, for example, a compound having two or more constituent units (repeating units) represented by Formula (b) below.

[Chem. 4]

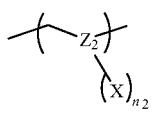

(b)

In Formula (b), X represents a hydroxy group or a carboxy group. $n_2$ X's may be identical or different from each other.

In Formula (b), $n_2$ represents an integer of 1 or greater. From the perspective of ease of obtaining and ease of dissolving in a solvent in preparing the temporary adhesive described above, and from the perspective of forming a polymer having a high softening point in the temporary adhesive, n2 is preferably an integer of 1 to 3 and more preferably an integer of 1 or 2.

The number of constituent units (repeating units) represented by Formula (b) above in the compound (B) is 2 or greater, and from the perspective of forming a polymer having a high softening point in the temporary adhesive described above, the number is preferably an integer from 2 to 40 and more preferably an integer from 10 to 30.

In Formula (b), $Z_2$ represents a group in which ($n_2$+2) hydrogen atoms are removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group. Examples of the structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group may include examples similar to the examples in $Z_1$ described above.

The compound (B) is preferably a styrene polymer, a (meth)acrylic polymer, a polyvinyl alcohol, a novolac resin, and a resole resin, and more preferably a compound having two or more of at least one type of constituent unit (repeating unit) selected from the group consisting of Formulas (b-1) to (b-6) below.

[Chem. 5]

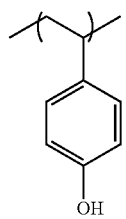

(b-1)

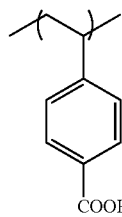

(b-2)

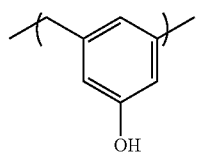

(b-3)

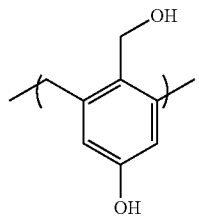

(b-4)

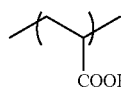

(b-5)

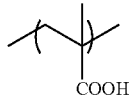

(b-6)

When a compound in which X in Formula (b) is a hydroxy group is employed as the compound (B), the proportion of the constituent units represented by Formula (b) in the total amount of the compound (B) is preferably not less than 30 mass %, more preferably not less than 50 mass %, and more preferably not less than 60 mass %. In addition, the proportion of the constituent units represented by Formula (b) in the total amount of the compound (B) is preferably not less than 30 mol % and more preferably not less than 50 mol %.

When a compound in which X in Formula (b) is a carboxy group is employed as the compound (B), the proportion of the constituent units represented by Formula (b) in the total amount of the compound (B) is preferably not less than 1 mass %, more preferably not less than 5 mass %, and more preferably not less than 10 mass %.

The proportion of the constituent units represented by Formula (b) within the above range is suitable for ensuring a sufficient distance between crosslinking points and a sufficient number of crosslinking points in the compound (B). Thus, the ratio is suitable for ensuring weight average molecular weight and a high softening point to a polymer obtained by polymerization of the compound (B) and the compound (A) described above in the temporary adhesive described above, and in turn suitable for ensuring high adhesion retentivity in the temporary adhesive layer 2 formed from the temporary adhesive in high temperature environments.

The compound (B) may be a homopolymer having only the constituent units represented by Formula (b) or may be a copolymer having the constituent units represented by Formula (b) and any other constituent unit. When the compound (B) is a copolymer, the compound (B) may be any of a block copolymer, a graft copolymer, and a random copolymer.

The any other constituent unit in the compound (B) is a constituent unit derived from a polymerizable monomer, the constituent unit having neither a hydroxy group nor a carboxy group, and examples of the polymerizable monomer include olefins, aromatic vinyl compounds, unsaturated carboxylic acid esters, carboxylic acid vinyl esters, and unsaturated dicarboxylic acid diesters. Examples of the olefins include chain olefins (in particular, $C_{2-12}$ alkenes), such as ethylene, propylene, and 1-butene; and cyclic olefins (in particular, $C_{3-10}$ cycloalkenes), such as cyclopentene, cyclohexene, cycloheptene, norbornene, 5-methyl-2-norbornene, and tetracyclododecene. Examples of the aromatic vinyl compounds include $C_{6-14}$ aromatic vinyl compounds, such as styrene, vinyl toluene, a-methylstyrene, 1-propenylbenzene, 1-vinylnaphthalene, 2-vinylnaphthalene, 3-vinylpyridine, 3-vinylfuran, 3-vinylthiophene, 3-vinylquinoline, indene, methylindene, ethylindene, and dimethylindene. Examples of the unsaturated carboxylic acid esters include esters, such as ethyl (meth)acrylate, butyl (meth)acrylate, isobutyl (meth)acrylate, 2-ethylhexyl (meth) acrylate, and dicyclopentanyl (meth)acrylate, obtained by reacting an unsaturated carboxylic acid (e.g., (meth)acrylic acid) with an alcohol (R"—OH) (The R" is a group in which one hydrogen atom is removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group. Examples of R" may include monovalent groups corresponding to the divalent groups exemplified for $Z_1$ in Formula (a) above). Examples of the carboxylic acid vinyl esters include $C_{1-16}$ fatty acid vinyl esters, such as vinyl acetate, vinyl propionate, vinyl caprylate, and vinyl caproate. Examples of the unsaturated dicarboxylic acid diesters may include maleic acid di $C_{1-10}$ alkyl esters, such as diethyl maleate, dibutyl maleate, dioctyl maleate, and 2-ethylhexyl maleate; and fumaric acid diesters corresponding to these esters. One of these esters can be used alone or two or more in combination.

When the compound (B) is a copolymer, the compound (B) is preferably a compound containing the constituent units represented by Formula (b) above, and a constituent unit derived from at least one polymerizable monomer selected from the group consisting of a chain olefin, a cyclic olefin, an aromatic vinyl compound, an unsaturated carboxylic acid ester, a carboxylic acid vinyl ester, and an unsaturated dicarboxylic acid diester.

The softening point (Ti) of the compound (B) is, for example, not lower than 50° C., preferably not lower than 80° C., and more preferably not lower than 100° C. Such a configuration is suitable for achieving a high softening point for a polymer obtained by polymerization of the compound (B) and the polyvalent vinyl ether compound (A) described above. In addition, from the perspective of ensuring proper fluidity to achieve good coating properties in the temporary adhesive described above, $T_1$ is, for example, not higher than 250° C., preferably not higher than 200° C., and more preferably not higher than 150° C.

$T_1$ can be adjusted for example, by controlling the weight average molecular weight (by the GPC method calibrated with polystyrene standards) of the compound (B). The weight average molecular weight of the compound (B) is, for example, not lower than 1500, preferably from 1800 to 10000, and more preferably from 2000 to 5000.

The thermoplastic resin (C) described above in the temporary adhesive needs to be a compound having thermoplasticity and capable of imparting flexibility to an adhesive composition when contained in the adhesive composition. Examples of such a thermoplastic resin (C) may include polycondensation resins, such as polyvinyl acetal resins, polyester resins, polyurethane resins, polyamide resins, poly (thio)ether resins, polycarbonate resins, polysulfone resins, and polyimide resins; vinyl polymerized resins, such as polyolefin resins, (meth)acrylic resins, styrene resins, and vinyl resins; and resins derived from natural products, such as cellulose derivatives.

One of these resins can be used alone or two or more in combination. The configuration in which the temporary adhesive described above contains such a thermoplastic resin (C) is suitable for imparting flexibility or pliability in the temporary adhesive layer 2 to be formed, suitable for preventing the occurrence of spontaneous peeling or a crack also in an environment where the temperature changes rapidly, and is suitable for ensuring excellent adhesiveness.

The thermoplastic resin (C) in the temporary adhesive is preferably at least one selected from the group consisting of polyvinyl acetal resins, polyester resins, polyurethane resins, and polyamide resins. From the perspective of easily imparting flexibility in the temporary adhesive or the temporary adhesive layer 2, and from the perspective of easily removing a glue residue if chemical interaction to an adherend, such as a wafer, reduces, and a glue residue remains on the adherend after peeling, the temporary adhesive preferably contains a polyester resin as the thermoplastic resin (C). Furthermore, in addition to the perspective of easily imparting flexibility in the temporary adhesive or the temporary adhesive layer 2 and the perspective of easily removing a glue residue on an adherend, from the perspective of ensuring high adhesion to an adherend, the temporary adhesive preferably contains a polyester resin and a polyvinyl acetal resin as the thermoplastic resins (C).

Examples of the polyvinyl acetal resin may include resins having at least a constituent unit represented by the formula below, the constituent unit obtained by reacting an aldehyde (RCHO) with a polyvinyl alcohol. Examples of the aldehyde (RCHO) include compounds in which R in the structural formula (R in the formula below is also the same) is a hydrogen atom, a linear $C_{1-5}$ alkyl group, a branched $C_{2-5}$ alkyl group, or a $C_{6-10}$ aryl group. Examples specifically include formaldehyde, butyraldehyde, and benzaldehyde. Such a polyvinyl acetal resin may have any other constituent unit in addition to the constituent unit represented by the formula below. That is, the polyvinyl acetal resin includes a homopolymer and a copolymer. Examples of such a polyvinyl acetal resin may specifically include polyvinyl formal and polyvinyl butyral, and a commercially available product, for example, "S-LEC KS-1 (trade name)" or "S-LEC KS-10 (trade name)" (both available from Sekisui Chemical Co., Ltd.) can be used.

[Chem. 6]

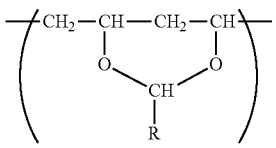

Examples of the polyester resin include polyesters obtained by polycondensation of a diol component and a dicarboxylic acid component. Examples of the diol component include aliphatic $C_{2-12}$ diols, such as ethylene glycol; polyoxy $C_{2-4}$ alkylene glycols, such as diethylene glycol; alicyclic $C_{5-15}$ diols, such as cyclohexanedimethanol; and aromatic $C_{6-20}$ diols, such as bisphenol A. Examples of the dicarboxylic acid component include aromatic $C_{8-20}$ dicarboxylic acids, such as terephthalic acid; aliphatic $C_{2-40}$ dicarboxylic acids, such as adipic acid; and alicyclic $C_{8-15}$ dicarboxylic acids, such as cyclohexanedicarboxylic acid. Examples of the polyester resin also include polyesters obtained by polycondensation of oxycarboxylic acid. Examples of the oxycarboxylic acid include aliphatic $C_{2-6}$ oxycarboxylic acids, such as lactic acid, and aromatic $C_{7-19}$ oxycarboxylic acids, such as hydroxybenzoic acid. Examples of the polyester resin also include polyesters obtained by ring-opening polymerization of lactone. Examples of the lactone include $C_{4-12}$ lactones, such as ε-caprolactone, δ-valerolactone, and γ-butyrolactone. Examples of the polyester resin also include polyesters containing a urethane bond obtained by reacting a polyester diol and a diisocyanate. The polyester resin includes a homopolyester and a copolyester. In addition, as the polyester resin, a commercially available product, for example, "Placcel H1P (trade name)" (available from Daicel Corporation) can be used.

Examples of the polyurethane resins may include resins obtained by reaction between a diisocyanate and a polyol, and a chain extender used as necessary. Examples of the diisocyanate include aliphatic diisocyanates, such as hexamethylene diisocyanate; alicyclic diisocyanates, such as isophorone diisocyanate; and aromatic diisocyanates, such as tolylene diisocyanate. Examples of the polyol include polyester diols, polyether diols, and polycarbonate diols. Examples of the chain extender include $C_{2-10}$ alkylene diols, such as ethylene glycol; aliphatic diamines, such as ethylene diamine; alicyclic diamines, such as isophorone diamine; and aromatic diamines, such as phenylene diamine.

Examples of the polyamide resins may include polyamides obtained by polycondensation of a diamine component and a dicarboxylic acid component, polyamides obtained by polycondensation of an aminocarboxylic acid, polyamides obtained by ring-opening polymerization of a lactam, and polyesteramides obtained by polycondensation of a diamine component, a dicarboxylic acid component, and a diol component. Examples of the diamine component include $C_{4-10}$ alkylene diamines, such as hexamethylene diamine. Examples of the dicarboxylic acid component include $C_{4-20}$ alkylene dicarboxylic acids, such as adipic acid. Examples of the aminocarboxylic acids include $C_{4-20}$ aminocarboxylic acids, such as ω-aminoundecanoic acid. Examples of the lactam include $C_{4-20}$ lactams, such as ω-laurolactam. Examples of the diol component include $C_{2-12}$ alkylene diols, such as ethylene glycol. In addition, the polyamide resins include homopolyamides and copolyamides.

The softening point ($T_2$) of the thermoplastic resin (C) is preferably at least 10° C. higher than the heat curing temperature of a permanent adhesive described later used in combination with the temporary adhesive containing the thermoplastic resin (C) in the method of manufacturing a semiconductor device according to an embodiment of the present invention. The difference between the heat curing temperature of the permanent adhesive and $T_2$ is, for example, from 10 to 40° C. and preferably from 20 to 30° C.

$T_2$ can be adjusted, for example, by controlling the weight average molecular weight (Mw: by the GPC method calibrated with polystyrene standards) of the thermoplastic resin (C). The weight average molecular weight of the thermoplastic resin (C) is, for example, from 1500 to 100000, preferably from 2000 to 80000, more preferably from 3000 to 50000, more preferably from 10000 to 45000, and more preferably from 15000 to 35000.

In the temporary adhesive containing at least the polyvalent vinyl ether compound (A), the compound (B), and the thermoplastic resin (C) as described above, the softening point ($T_3$) of the polymer of the polyvalent vinyl ether compound (A) and the compound (B) is at least 10° C. higher than the heat curing temperature of a permanent adhesive described later used in combination with the temporary adhesive in the method of manufacturing a semiconductor device according to an embodiment of the present invention. The difference between the heat curing temperature of the permanent adhesive and $T_3$ is, for example, from 10 to 40° C. and preferably from 20 to 30° C.

When the heat curing temperature of the permanent adhesive described later is, for example, 120° C., the content of the polyvalent vinyl ether compound (A) in the temporary adhesive is in an amount corresponding to an amount of vinyl ether groups in the polyvalent vinyl ether compound (A) of, for example, 0.01 to 10 mol, preferably an amount of 0.05 to 5 mol, more preferably of 0.07 to 1 mol, and more preferably of 0.08 to 0.5 relative to a total amount of 1 mol of hydroxy groups and carboxy groups in the compound (B) in the temporary adhesive.

The content of the thermoplastic resin (C) in the temporary adhesive is, for example, from 0.1 to 3 parts by mass, preferably from 0.2 to 2 parts by mass, and more preferably from 0.3 to 1 part by mass relative to 1 part by mass of the compound (B) in the temporary adhesive.

The total content of the polyvalent vinyl ether compound (A), the compound (B), and the thermoplastic resin (C) in the temporary adhesive is, for example, from 70 to 99.9 mass %, preferably from 80 to 99 mass %, more preferably from 85 to 95 mass %, and more preferably from 85 to 90 mass % of the total non-volatile content of the temporary adhesive.

The temporary adhesive may further contain a polymerization accelerator. Examples of the polymerization accelerator may include a monovalent carboxylic acid represented by Formula (d) below and a monovalent alcohol represented by Formula (e) below. One of these polymerization accelerators can be used alone or two or more in combination. The configuration in which the temporary adhesive contains a polymerization accelerator is suitable for accelerating the polymerization reaction of the polyvalent vinyl ether compound (A) and the compound (B). The configuration is suitable for forming a polymer having an equivalent softening point or higher softening point even in lowering the heating temperature during polymerization in comparison with using an adhesive containing no polymerization accelerator and thus is suitable for ensuring adhesiveness in the temporary adhesive 2 in high temperature environments (e.g., approximately from 160 to 180° C.).

$$Z_3\text{—COOH} \quad (d)$$

where $Z_3$ represents a group that may have a substituent other than a carboxy group, the group in which one hydrogen atom is removed from a structural formula of one selected from the group consisting of saturated or unsaturated aliphatic hydrocarbons, saturated or unsaturated alicyclic hydrocarbons, and aromatic hydrocarbons.

$$Z_4\text{—OH} \quad (e)$$

where $Z_4$ represents a group that may have a substituent other than a hydroxy group, the group in which one hydrogen atom is removed from a structural formula of an aromatic hydrocarbon.

Examples of the saturated or unsaturated aliphatic hydrocarbon, saturated or unsaturated alicyclic hydrocarbon, and aromatic hydrocarbon in $Z_3$ in Formula (d) above may include saturated or unsaturated aliphatic hydrocarbons, saturated or unsaturated alicyclic hydrocarbons, and aromatic hydrocarbons exemplified for $Z_1$ in Formula (a) above. Examples of the substituent that may be included in $Z_3$ may include examples of the substituent that may be included in $Z_1$ excluding a carboxy group. In addition, examples of the aromatic hydrocarbon in $Z_4$ in Formula (e) above may include aromatic hydrocarbons exemplified for $Z_1$ in Formula (a) above. Examples of the substituent that may be included in $Z_4$ may include examples of the substituent that may be included in $Z_1$ excluding a hydroxy group.

When a polymerization accelerator is contained in the temporary adhesive, the pKa (acid dissociation constant) of the polymerization accelerator is preferably from 3 to 8 and more preferably from 4 to 6. Such a configuration is suitable for inhibiting unintended polymerization and the resulting increase in viscosity or the like in the temporary adhesive to ensure storage stability, as well as for ensuring the polymerization promoting effect by the polymerization accelerator in forming the temporary adhesive layer 2 from the temporary adhesive.

The monovalent carboxylic acid represented by Formula (d) is preferably compounds (including geometric isomers) shown below.

[Chem. 7]

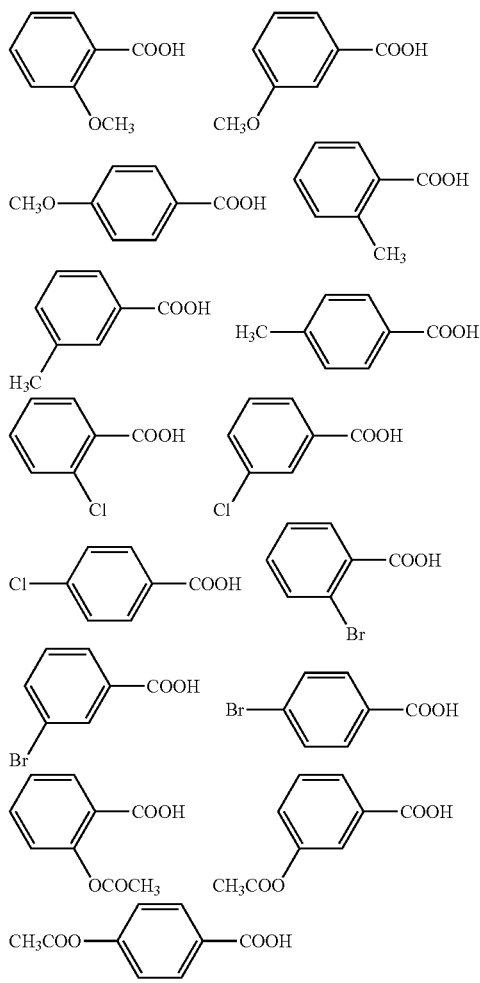

[Chem. 8]

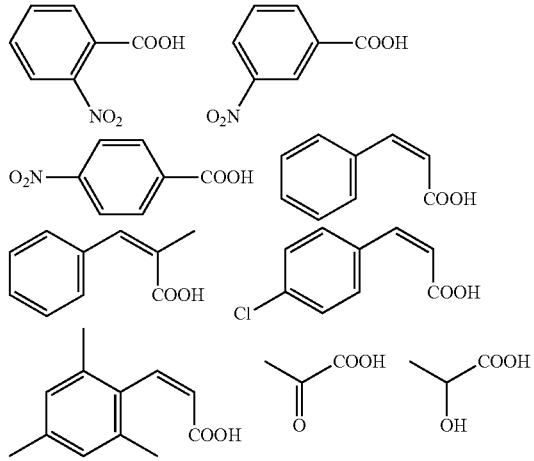

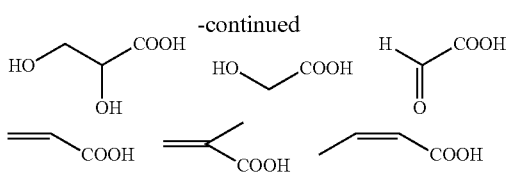

The monovalent alcohol represented by Formula (e) is preferably compounds shown below.

[Chem. 9]

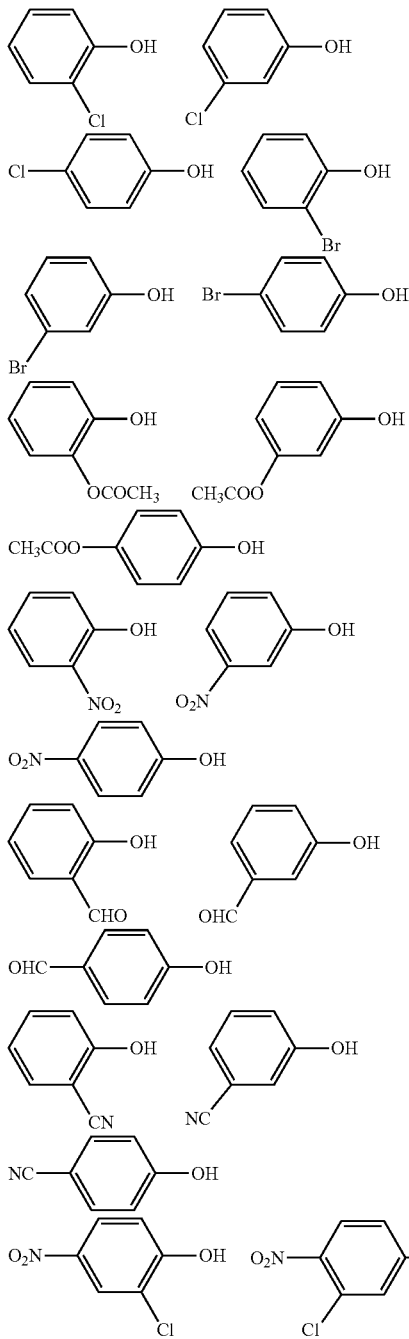

When a polymerization accelerator is contained in the temporary adhesive, the content of the polymerization accel-erator is, for example, approximately from 0.01 to 5 parts by mass, preferably from 0.1 to 3 parts by mass, and more preferably from 0.3 to 1 part by mass relative to 1 part by mass of the polyvalent vinyl ether compound (A) contained in the temporary adhesive.

The temporary adhesive may further contain an antioxidant. The configuration in which the temporary adhesive contains an antioxidant is suitable for preventing oxidation of the compound (B) and the thermoplastic resin (C) described above in the temporary adhesive during heat treatment of the temporary adhesive. The antioxidation of the compound (B) and the thermoplastic resin (C) in the temporary adhesive is suitable for ensuring solubility of a softened composition obtained by heat-treating the temporary adhesive layer 2 formed from the temporary adhesive. Thus, the antioxidation is suitable for removing a glue residue if remains on an adherend, such as a wafer, after peeling the temporary adhesive layer 2 from the adherend through heat treatment.

Examples of the antioxidant may include phenolic antioxidants, phosphorus antioxidants, thioester antioxidants, and amine antioxidants. One of these antioxidants can be used alone or two or more in combination. Phenolic antioxidants have a particularly excellent antioxidant effect during heat treatment and thus are preferred as an antioxidant in the temporary adhesive.

Examples of the phenolic antioxidants may include pentaerythritol tetrakis[3(3,5-di-t-butyl-4-hydroxyphenyl)propionate], thiodiethylene bis[3-(3,5-di-t-butyl-4-hydroxyphenyl)propionate], octadecyl 3-(3,5-di-t-butyl-4-hydroxyphenyepropionate, N,N'-hexamethylene bis[3-(3,5-di-t-butyl-4-hydroxyphenyl)propionamide], octyl 3-(4-hydroxy-3,5-diisopropylphenyl)propionate, 1,3,5-tris(4-hydroxy-3,5-di-t-butylbenzyl)-2,4,6-trimethylbenzene, 2,4-bis(dodecylthiomethyl)-6-methylphenol, and calcium bis[3,5-di(t-butyl)-4-hydroxybenzyl(ethoxy)phosphinate]. As the phenolic antioxidant, a commercially available product under the trade name, for example, "Irganox 1010", "Irganox 1035", "Irganox 1076", "Irganox 1098", "Irganox 1135", "Irganox 1330", "Irganox 1726", or "Irganox 1425WL" (all available from BASF) can be used.

When an antioxidant is contained in the temporary adhesive, the content of the antioxidant is, for example, from 0.01 to 15 parts by mass, preferably from 0.1 to 12 parts by mass, and more preferably from 0.5 to 10 parts by mass relative to 100 parts by mass of the compound (B) and the thermoplastic resin (C) contained in the temporary adhesive.

The temporary adhesive may further contain additional component as necessary. Examples of the additional component may include an acid generator, a surfactant, a solvent, a leveling agent, a silane coupling agent, and a foaming agent. One of these components can be used alone or two or more in combination.

When a surfactant is contained in the temporary adhesive, the content of the surfactant in the temporary adhesive is preferably approximately from 0.01 to 1 mass %. Such a configuration is suitable for preventing repelling during the coating of the temporary adhesive and is suitable for ensuring the uniformity of the coating. Examples of such a surfactant include products under the trade names "F-444", "F-447", "F-554", "F-556", and "F-557" (all are fluorine oligomers available from DIC Corporation), a product under the trade name "BYK-350" (an acrylic polymer available from BYK), and products under the trade names "A-1420", "A-1620", and "A-1630" (all are fluorine-containing alcohols available from Daikin Industries, Ltd.). One of these surfactants can be used alone or two or more in combination.

The temporary adhesive preferably contains a solvent from the perspective of adjusting the viscosity of the temporary adhesive. Examples of the solvent include toluene, hexane, isopropanol, methyl isobutyl ketone, cyclopentanone, cyclohexanone, propylene glycol monomethyl ether acetate, propylene glycol monomethyl ether, and y-butyrolactone. One of these solvents can be used alone or two or more in combination. When the temporary adhesive contains a solvent, the solvent content in the temporary adhesive is, for example, from 55 to 80 mass %.

The temporary adhesive can be prepared by stirring and mixing the components while air bubbles are removed under vacuum as necessary. The temperature of the mixture during stirring and mixing is preferably approximately from 10 to 80° C. For stirring and mixing, a rotation-revolution mixer, a single-axis or multi-axis extruder, a planetary mixer, a kneader, or a resolver can be used.

The viscosity of the temporary adhesive (viscosity measured under conditions of 25° C. and a shear rate of 50/s) is, for example, approximately from 30 to 2000 mPa·s, preferably from 300 to 1500 mPa·s, and more preferably from 500 to 1500 mPa·s. Such a configuration is suitable for ensuring the coating properties of the temporary adhesive and uniformly coating the temporary adhesive on the surface of an adherend, such as a wafer.

The temporary adhesive as described above is coated on the surface of an adherend, such as a wafer, and then heat-treated. This allows vinyl ether groups of the polyvalent vinyl ether compound (A) and hydroxy groups and/or carboxy groups of the compound (B) in the temporary adhesive to be bonded with acetal bonds to form a polymer from the polyvalent vinyl ether compound (A) and the compound (B). For example, when a temporary adhesive containing a compound represented by Formula (a') below as the polyvalent vinyl ether compound (A) and containing a compound having a constituent unit represented by Formula (b') below as the compound (B) is heat-treated to polymerize both compounds, a polymer represented by Formula (P) below is produced.

[Chem. 10]

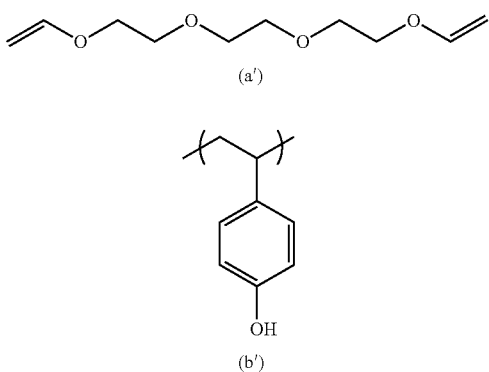

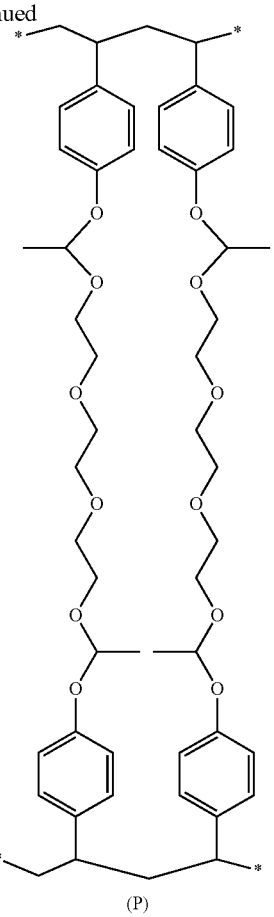

The softening point ($T_3$) of the polymer obtained by heat-treating the temporary adhesive can be controlled by adjusting the relative amounts of the polyvalent vinyl ether compound (A) and the compound (B). When the heat curing temperature of a permanent adhesive described later used in combination with the temporary adhesive is 120° C., the softening point ($T_3$) of the polymer is, for example, not lower than 130° C., preferably from 130 to 170° C., and more preferably from 140 to 160° C.

Each softening point of the polymer of the polyvalent vinyl ether compound (A) and the compound (B), the polyvalent vinyl ether compound (A), the compound (B), and the thermoplastic resin (C) can be measured using a Koka flow tester under the flow conditions below.

Flow conditions
Pressure: 100 kg/cm$^2$
Speed: 6° C/min
Nozzle: 1 mm φ×10 mm [0085]

In addition, the softening point of the temporary adhesive layer formed from the temporary adhesive is the temperature determined as follows. First, 0.1 g of the temporary adhesive is coated on a first glass plate at a thickness of 10 μm to form a coating of the temporary adhesive. Then, a second glass plate is overlaid on the coating. Then, this is heat-treated to polymerize the polyvalent vinyl ether compound (A) and the compound (B) in the temporary adhesive between the first and second glass plates to cure the temporary adhesive, thus bonding both glass plates via the temporary adhesive. The heat treatment includes, for example, heating at 140° C. for 2 minutes, followed by heating at 200° C. for 2 minutes, and followed by heating at 230° C. for 4 minutes. Such adhesive bonding provides a laminate having a laminated structure of the first glass plate, the second glass plate, and the temporary adhesive layer between the first and second glass plates. For this laminate, in a state where the second glass plate is fixed, the first glass plate is pulled in the horizontal direction (in-plane direction of the glass plate) by applying a stress of 2 kg under heating, and the temperature at which the first glass plate starts to move is measured. The temperature determined as described above is taken as the softening point.

In the present method of manufacturing a semiconductor device, then, as illustrated in FIG. 1(b), the wafer 1 is preferably thinned in the reinforced wafer 1R (thinning step). Specifically, the wafer 1 in a state of being supported by the supporting substrate S is thinned to a predetermined thickness by grinding from the back surface 1b side of the wafer 1 using a grinder to form a thinned wafer 1T. The thickness of the wafer 1 (thinned wafer 1T) after thinning is from 1 to 20 μm, preferably from 0.5 to 18 μm, and more preferably from 1 to 15 μm.

Figure 3:
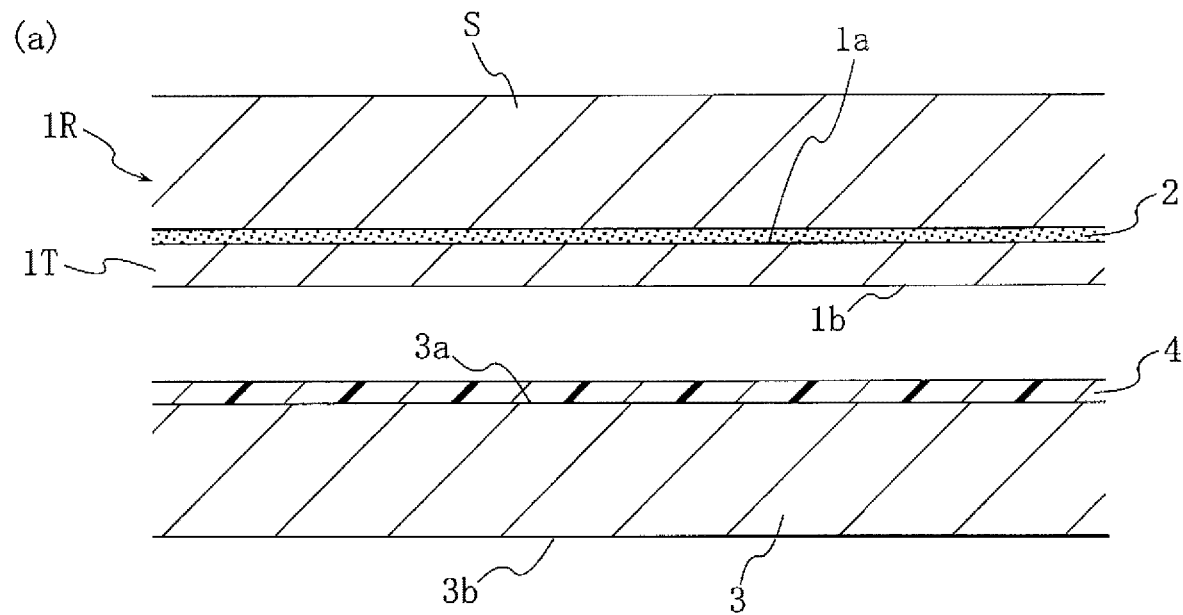
FIG. 3 illustrates some processes in a method of manufacturing a semiconductor device according to an embodiment of the present invention.
Figure 3:
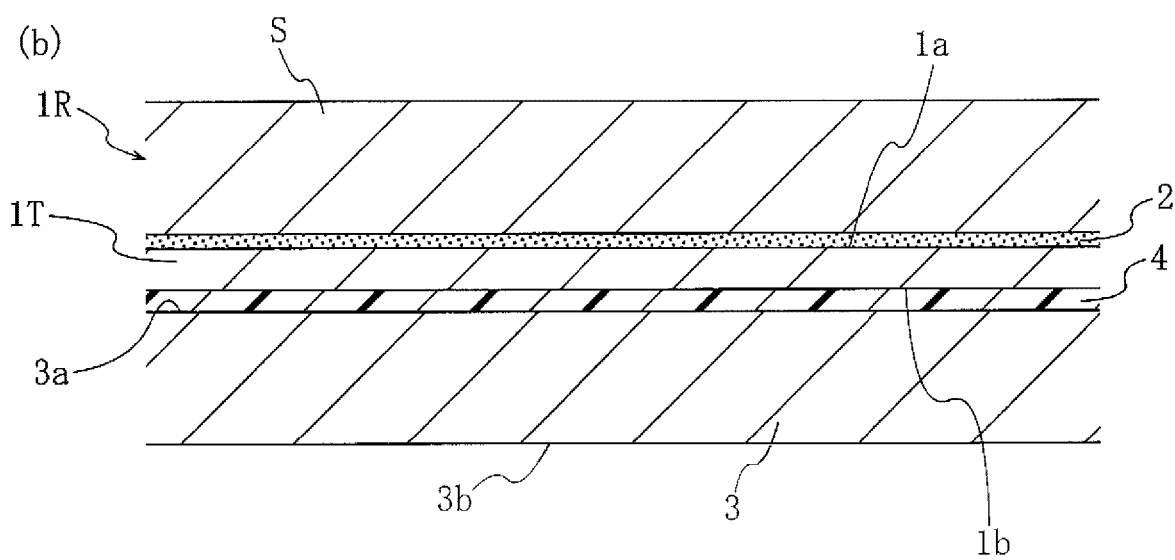
Figure 4:
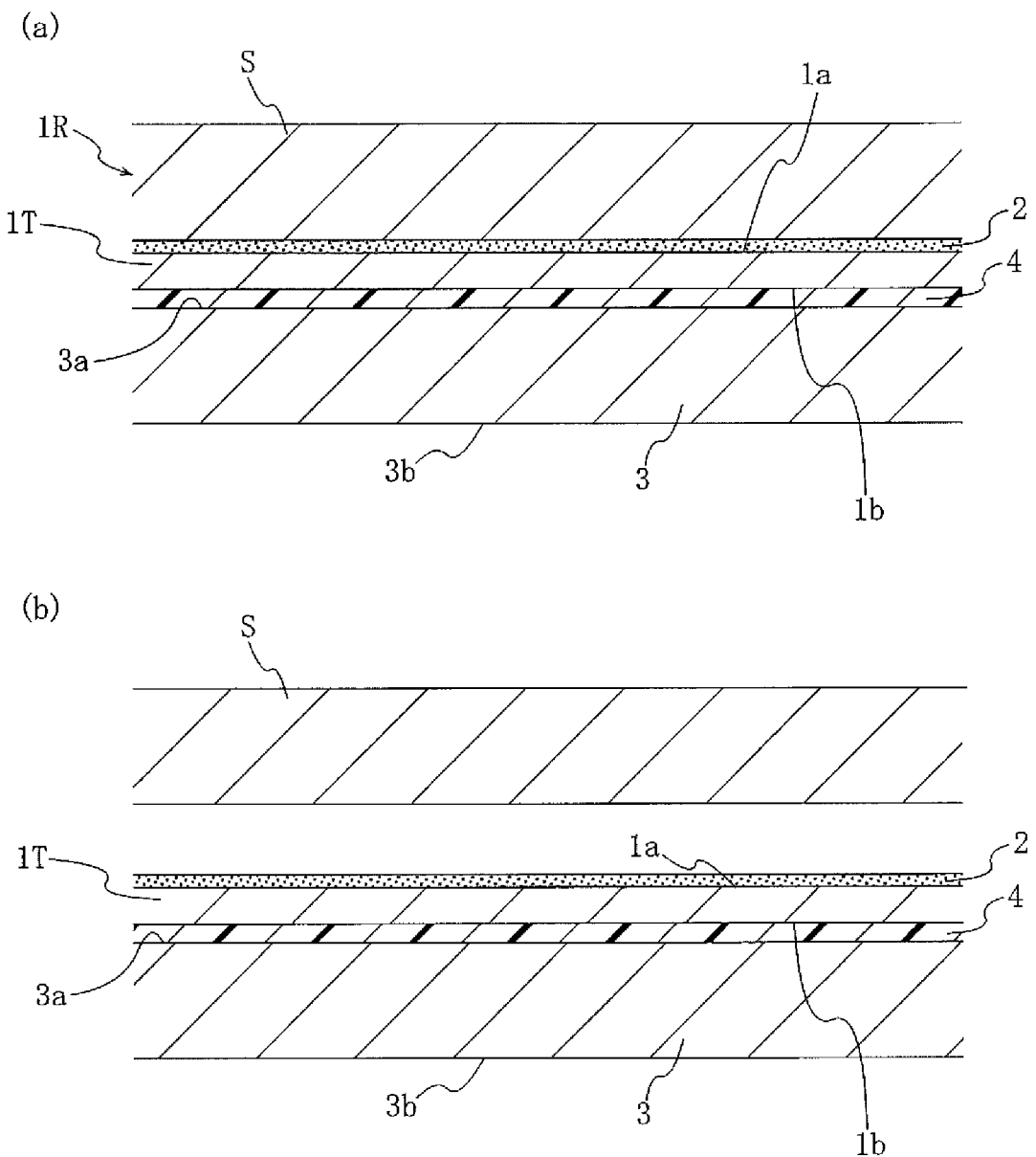
FIG. 4 illustrates some processes in a method of manufacturing a semiconductor device according to an embodiment of the present invention.
Figure 5:
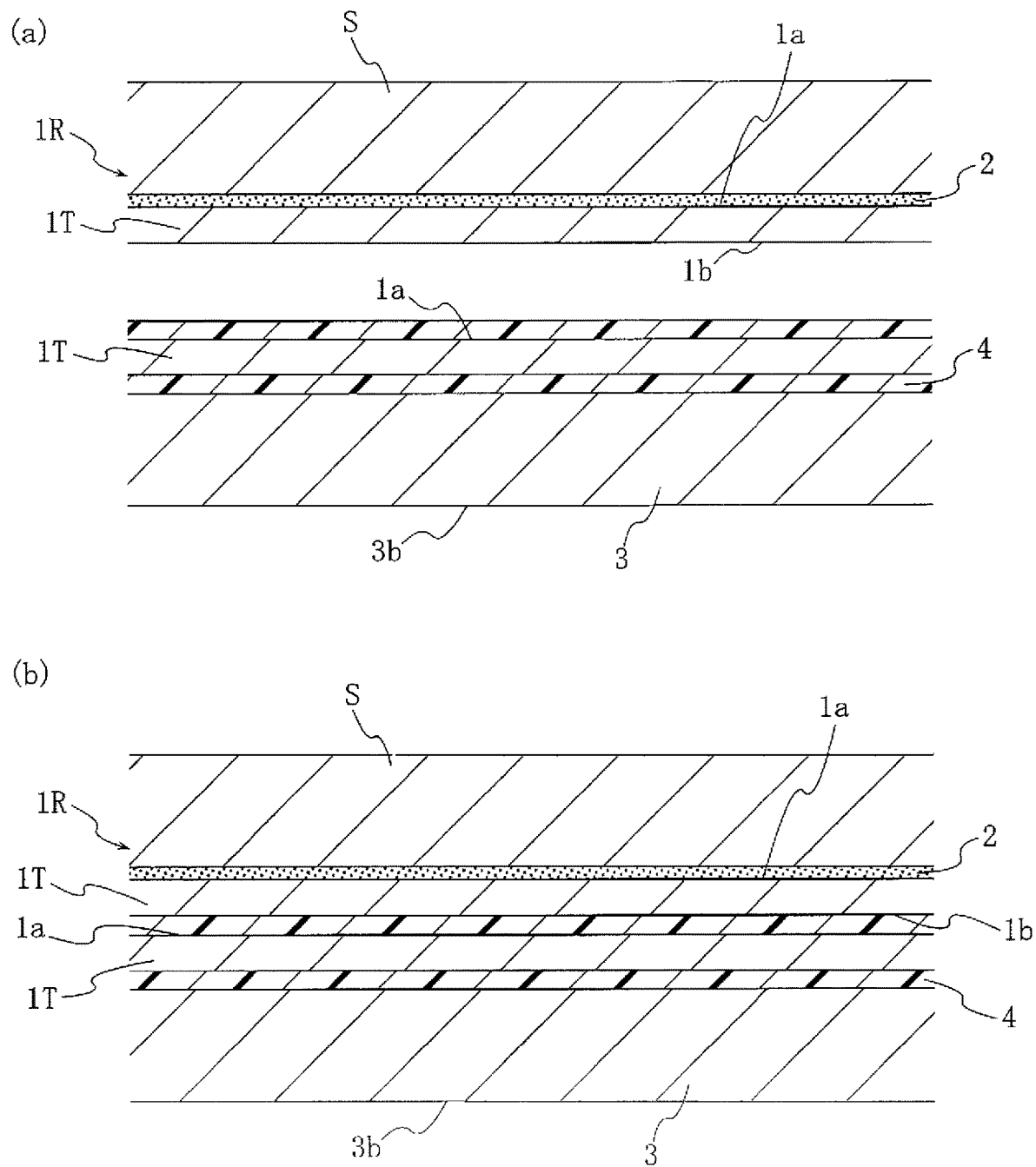
FIG. 5 illustrates some processes in a method of manufacturing a semiconductor device according to an embodiment of the present invention.
Figure 6:
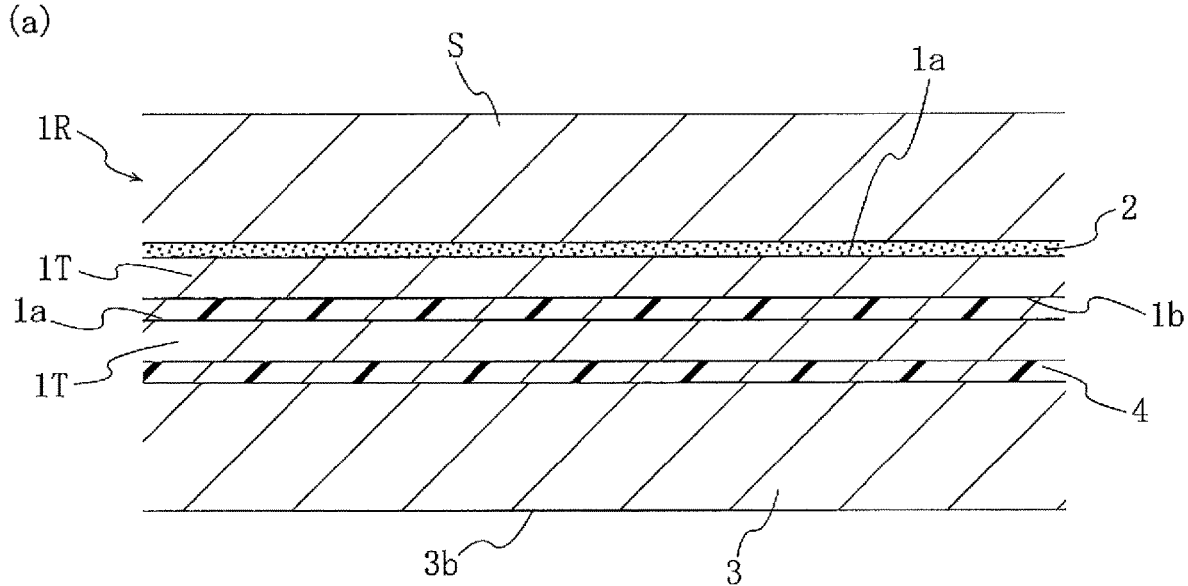
FIG. 6 illustrates some processes in a method of manufacturing a semiconductor device according to an embodiment of the present invention.
Figure 6:
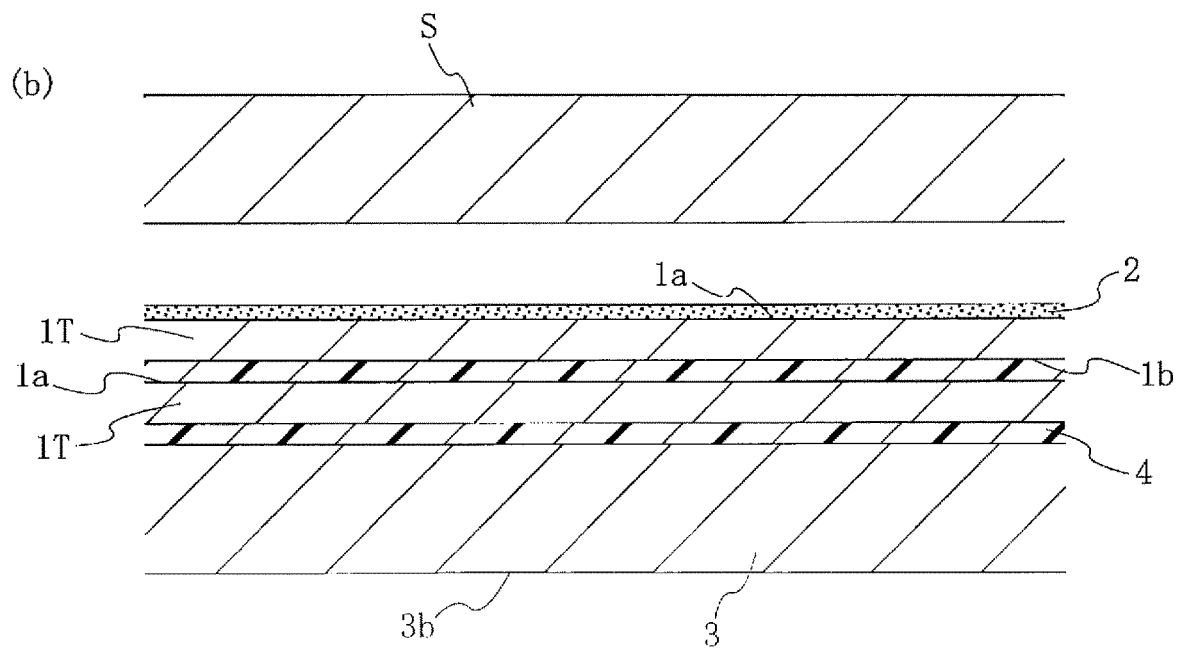

Then, for example, as illustrated in FIG. 3, the thinned wafer 1T side of the reinforced wafer 1R is bonded to a wafer 3 (first wafer), which is a base wafer, via an adhesive for forming an adhesive layer 4 (bonding step).

The wafer 3 (first wafer) is a base wafer having a semiconductor wafer main body in which a semiconductor element can be fabricated, and has a main surface 3a and a back surface 3b opposite from the main surface 3a. The wafer 3 is a semiconductor wafer in which various semiconductor elements (not illustrated) are already fabricated on the main surface 3a side, and a wiring structure (not illustrated) including a wiring pattern necessary for the semiconductor elements is already formed on the main surface 3a. As the constituent material for forming the semiconductor wafer main body of the wafer 3, for example, the materials listed above as constituent materials for forming the semiconductor wafer main body of the wafer 1 can be employed. The thickness of the wafer 3, which is the base wafer, is preferably not less than 300 μm, more preferably not less than 500 μm, and more preferably not less than 700 μm from the perspective of ensuring strength of the wafer 3 during the manufacturing process. From the perspective of reducing the grinding time in grinding on the wafer 3, the grinding described later, the thickness of the wafer 3 is preferably not greater than 1000 μm, more preferably not greater than 900 μm, and more preferably not greater than 800 μm.

The adhesive for forming the adhesive layer 4 has an etching rate of 1 to 2 μμm/min in dry etching performed using an etching gas containing $CF_4$, $O_2$, and Ar at a volume ratio of 100:400:200 under conditions of an atmospheric pressure of 100 mTorr and a high frequency power supply power of 2000 W. The etching rate is preferably from 1.1 to 1.9 μm/min, more preferably from 1.2 to 1.8 μm/min, and more preferably from 1.3 to 1.7 μm/min.

The adhesive for forming the adhesive layer 4 is a thermosetting adhesive for achieving a wafer-to-wafer bonding and preferably contains a polymerizable group-containing polyorganosilsesquioxane (i.e., a polyorganosilsesquioxane having a polymerizable functional group) as a thermosetting resin. The polymerizable functional group contained in the polymerizable group-containing polyorganosilsesquioxane is preferably an epoxy group or a (meth) acryloyloxy group. The polymerizable group-containing polyorganosilsesquioxane is suitable for achieving high heat resistance in an adhesive layer to be formed as well as achieving lower curing temperature for forming the adhesive layer and thus preventing damage to the elements in the wafer as an adherend. The content ratio of the polymerizable group-containing polyorganosilsesquioxane in the adhesive for forming the adhesive layer 4 is, for example, not less than 70 mass %, preferably from 80 to 99.8 mass %, and more preferably from 90 to 99.5 mass %.

In the present embodiment, the polymerizable group-containing polyorganosilsesquioxane contained in the adhesive for forming the adhesive layer 4 contains, as siloxane constituent units, a first constituent unit [$RSiO_{3/2}$] containing at least a constituent unit represented by Formula (1) below and a second constituent unit [$RSiO_{2/2}(OR')$] containing at least a constituent unit represented by Formula (2) below (R and R' in the second constituent unit may be identical or different). These constituent units belong to what are called T units in the siloxane constituent units, and in the present embodiment, the constituent unit [$RSiO_{3/2}$] is a T3 form, and the constituent unit [$RSiO_{2/2}(OR')$] is a T2 form. In the T3 form, the silicon atom is bonded to three oxygen atoms, each oxygen atom also bonded to a silicon atom in another siloxane constituent unit. In the T2 form, the silicon atom is bonded to two oxygen atoms, each oxygen atom also bonded to a silicon atom in another siloxane constituent unit, and bonded to an oxygen of an alkoxy group or a hydroxy group. Both such a T3 form and a T2 form belong to T units as siloxane constituent units as described above and are partial structures of polymerizable group-containing polyorganosilsesquioxanes that can be formed by hydrolysis of a silane compound having three hydrolyzable functional groups and a subsequent condensation reaction.

[Chem. 11]

$R^1$ in Formula (1) and $R^1$ in Formula (2) each represent a group containing an epoxy group or a (meth)acryloyloxy group, and $R^2$ in Formula (2) represents a hydrogen atom or an alkyl group having from 1 to 4 carbon atoms. [0094]

Examples of R' in Formula (1) and Formula (2) when each $R^1$ is an epoxy group-containing group include groups represented by Formulas (3) to (6) below. Each of $R^3$, $R^4$, $R^5$, and $R^6$ in Formulas (3) to (6) represents a linear or branched alkylene group having, for example, from 1 to 10 carbon atoms. Examples of such an alkylene group include a methylene group, a methylmethylene group, a dimethylmethylene group, an ethylene group, a propylene group, a trimethylene group, a tetramethylene group, a pentamethylene group, a hexamethylene group, and a decamethylene group. From the perspective of achieving high heat resistance and reducing shrinkage during curing in the adhesive layer 4, each $R^1$ as an epoxy group-containing group in Formula (1) and Formula (2) is preferably an epoxy group-containing group represented by Formula (3) or an epoxy group-containing group represented by Formula (4) and more preferably a 2-(3,4-epoxycyclohexyl)ethyl group, which is a group represented by Formula (3) where $R^3$ is an ethylene group.

[Chem. 12]

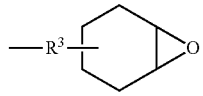

(3)

-continued

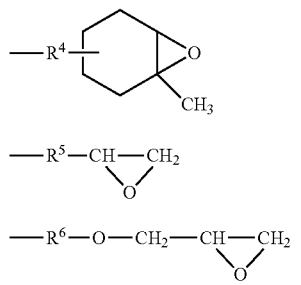

—R⁵—CH—CH₂ (5)
         \O/

—R⁶—O—CH₂—CH—CH₂ (6)
                \O/

As described above, $R^2$ in Formula (2) above represents a hydrogen atom or an alkyl group having from 1 to 4 carbon atoms, and thus, $OR^2$ in Formula (2) represents a hydroxy group or an alkoxy group having from 1 to 4 carbon atoms. Examples of the alkoxy group having from 1 to 4 carbon atoms include a methoxy group, an ethoxy group, a propoxy group, an isopropoxy group, a butoxy group, and an isobutyloxy group.

The polymerizable group-containing polyorganosilsesquioxane contained in the adhesive for forming the adhesive layer 4 may contain one type of constituent unit represented by Formula (1) above or may contain two or more types. The polymerizable group-containing polyorganosilsesquioxane may contain one type of constituent unit represented by Formula (2) above or may contain two or more types.

The polymerizable group-containing polyorganosilsesquioxane described above contained in the adhesive for forming the adhesive layer 4 may contain, as the above T3 form, a constituent unit represented by Formula (7) below in addition to the constituent unit represented by Formula (1). $R^7$ in Formula (7) represents a hydrogen atom, a substituted or unsubstituted alkyl group, a substituted or unsubstituted alkenyl group, a substituted or unsubstituted cycloalkyl group, a substituted or unsubstituted aryl group, or a substituted or unsubstituted aralkyl group. $R^7$ in Formula (7) is preferably a substituted or unsubstituted alkyl group, a substituted or unsubstituted alkenyl group, or a substituted or unsubstituted aryl group, and more preferably a phenyl group.
[Chem. 13]

$$[R^7SiO_{3/2}] \quad (7)$$

Examples of the alkyl group described above for $R^7$ include a methyl group, an ethyl group, a propyl group, an n-butyl group, an isopropyl group, an isobutyl group, an s-butyl group, a t-butyl group, and an isopentyl group. Examples of the alkenyl group described above for $R^7$ include a vinyl group, an allyl group, and an isopropenyl group. Examples of the cycloalkyl group described above for $R^7$ include a cyclobutyl group, a cyclopentyl group, and a cyclohexyl group. Examples of the aryl group described above for $R^7$ include a phenyl group, a tolyl group, and a naphthyl group. Examples of the aralkyl group described above for $R^7$ include a benzyl group and a phenethyl group.

Examples of the substituent of the alkyl group, alkenyl group, cycloalkyl group, aryl group, and aralkyl group described above for $R^7$ include an ether group; an ester group; a carbonyl group; a siloxane group; a halogen atoms, such as a fluorine atom; an acryl group; a methacryl group; a mercapto group; an amino group; and a hydroxyl group.

The polymerizable group-containing polyorganosilsesquioxane described above contained in the adhesive for forming the adhesive layer 4 may contain, as the above T2 form, a constituent unit represented by Formula (8) below in addition to the constituent unit represented by Formula (2). $R^7$ in Formula (8) represents a hydrogen atom, a substituted or unsubstituted alkyl group, a substituted or unsubstituted alkenyl group, a substituted or unsubstituted cycloalkyl group, a substituted or unsubstituted aryl group, or a substituted or unsubstituted aralkyl group and is specifically the same as $R^7$ in Formula (7) above. $R^2$ in Formula (8) represents a hydrogen atom or an alkyl group having from 1 to 4 carbon atoms and is specifically the same as $R^2$ in Formula (2) above.
[Chem. 14]

$$[R^7SiO_{2/2}(OR^2)] \quad (8)$$

The polymerizable group-containing polyorganosilsesquioxane described above contained in the adhesive for forming the adhesive layer 4 may contain in its siloxane constituent unit at least one type selected from the group consisting of what is called an M unit $[RSiO_{1/2}]$, what is called a D unit $[R_2SiO_{2/2}]$, and what is called a Q unit $[SiO_{4/2}]$ in addition to the first and second constituent units described above, which are T units.

The polymerizable group-containing polyorganosilsesquioxane may have any of a cage, incomplete cage, ladder, or random silsesquioxane structure or may have a combined structure of two or more of these silsesquioxane structures.

In all the siloxane constituent units of the polymerizable group-containing polyorganosilsesquioxane in the adhesive for forming the adhesive layer 4, the value of the molar ratio of the T3 form to the T2 form (i.e., T3 form/T2 form) is, for example, from 5 to 500, and the lower limit is preferably 10. The upper limit is preferably 100 and more preferably 50. For the polymerizable group-containing polyorganosilsesquioxane, adjustment of the value of [T3 form/T2 form] to the range improves compatibility with components other than the polymerizable group-containing containing polyorganosilsesquioxane contained in the adhesive for forming the adhesive layer 4, improving handleability. The value of [T3 form/T2 form] in the polymerizable group-containing polyorganosilsesquioxane of 5 to 500 means that the presence amount of the T2 form is relatively small relative to the T3 form, and the hydrolysis and the condensation reaction of silanol are more advanced.

The value of the molar ratio (T3 form/T2 form) in the polymerizable group-containing polyorganosilsesquioxane can be determined, for example, by $^{29}$Si-NMR spectroscopy measurements. In the $^{29}$Si-NMR spectrum, the silicon atom in the first constituent unit (T3 form) described above and the silicon atom in the second constituent unit (T2 form) described above indicate peaks or signals with different chemical shifts. The value of the molar ratio can be determined from the area ratio of these peaks. The $^{29}$Si-NMR spectrum of the polymerizable group-containing polyorganosilsesquioxane can be measured, for example, with the following instrument according to the following conditions.

Measuring instrument: "JNM-ECA500NMR (trade name)" (available from JEOL Ltd.)
Solvent: Deuteriochloroform
Number of scans: 1800 scans
Measurement temperature: 25° C.

The number average molecular weight (Mn) of the polymerizable group-containing polyorganosilsesquioxane contained in the adhesive for forming the adhesive layer 4 is preferably from 1000 to 50000, more preferably from 1500 to 10000, more preferably from 2000 to 8000, and more preferably from 2000 to 7000. The polymerizable group-containing polyorganosilsesquioxane with a number average molecular weight of not lower than 1000 improves insulating properties, heat resistance, crack resistance, and adhesiveness of a cured product or the adhesive layer to be formed. On the other hand, the polymerizable group-containing polyorganosilsesquioxane with a molecular weight of not higher than 50000 improves compatibility of the polymerizable group-containing polyorganosilsesquioxane in the adhesive with other components and improves insulating properties, heat resistance, and crack resistance of a cured product or the adhesive layer to be formed.

The molecular weight dispersity (Mw/Mn) of the polymerizable group-containing polyorganosilsesquioxane contained in the adhesive for forming the adhesive layer 4 is preferably from 1.0 to 4.0, more preferably from 1.1 to 3.0, and more preferably from 1.2 to 2.7. The polymerizable group-containing polyorganosilsesquioxane with a molecular weight dispersity of not greater than 4.0 further increases heat resistance, crack resistance, and adhesiveness of a cured product or the adhesive layer to be formed. On the other hand, the polymerizable group-containing polyorganosilsesquioxane with a molecular weight dispersity of not less than 1.0 allows the adhesive composition to easily become liquid, tending to improve its handleability.

The number average molecular weight (Mn) and the weight average molecular weight (Mw) of the polymerizable group-containing polyorganosilsesquioxane are values determined by gel permeation chromatography (GPC) and calculated on the basis of polystyrene. The number average molecular weight (Mn) and the weight average molecular weight (Mw) of the polymerizable group-containing polyorganosilsesquioxane can be measured using, for example, an HPLC instrument ("LC-20AD (trade name)" available from Shimadzu Corporation) according to the following conditions.

Column: Two Shodex K F-801 (upstream side, available from Showa Denko K. K.), Shodex K F-802 (available from Showa Denko K. K.), and Shodex K F-803 (downstream side, available from Showa Denko K. K.) are connected in series Measurement temperature: 40° C.

Eluent: Tetrahydrofuran (THF)

Sample concentration: From 0.1 to 0.2 mass %

Flow rate: 1 mL/min

Standard sample: Polystyrene

Detector: A UV-VIS detector ("SPD-20A (trade name)" available from Shimadzu Corporation)

The polymerizable group-containing polyorganosilsesquioxane as described above can be manufactured by hydrolysis of a silane compound having three hydrolyzable functional groups and a subsequent condensation reaction. The raw material used in the manufacturing includes at least a compound represented by Formula (9) below and, as necessary, a compound represented by Formula (10) below. The compound represented by Formula (9) is for forming the constituent unit represented by Formula (1) above and the constituent unit represented by Formula (2) above. The compound represented by Formula (10) is for forming the constituent unit represented by Formula (7) above and the constituent unit represented by Formula (8) above.

[Chem. 15]

$$R^1SiX^1{}_3 \quad (9)$$

$$R^7SiX^2{}_3 \quad (10)$$

$R^1$ in Formula (9) represents a group containing a polymerizable group and is specifically the same as $R^1$ in Formulas (1) and (2) above. $X^1$ in Formula (9) represents an alkoxy group or a halogen atom. Examples of the alkoxy group include alkoxy groups having from 1 to 4 carbon atoms, such as a methoxy group, an ethoxy group, a propoxy group, an isopropyloxy group, a butoxy group, and an isobutyloxy group. Examples of the halogen atom as $X^1$ include a fluorine atom, a chlorine atom, a bromine atom, and an iodine atom. $X^1$ is preferably an alkoxy group and more preferably a methoxy group or an ethoxy group. In Formula (9), three $X^1$'s may be identical or different from each other.

$R^7$ in Formula (10) represents a substituted or unsubstituted aryl group, a substituted or unsubstituted aralkyl group, a substituted or unsubstituted cycloalkyl group, a substituted or unsubstituted alkyl group, or a substituted or unsubstituted alkenyl group and is specifically the same as $R^7$ in Formulas (7) and (8) above. $X^2$ in Formula (10) represents an alkoxy group or a halogen atom and is specifically the same as $X^1$ in Formula (9) above.

The raw material used in the manufacturing of the polymerizable group-containing polyorganosilsesquioxane described above may further contain an additional hydrolyzable silane compound. Examples of such a compound include a hydrolyzable trifunctional silane compound other than the compounds represented by Formulas (9) and (10) above, a hydrolyzable monofunctional silane compound that is to form an M unit, a hydrolyzable bifunctional silane compound that is to form a D unit, and a hydrolyzable tetrafunctional silane compound that is to form a Q unit.

The amount of the hydrolyzable silane compound as the raw material to be used and its composition is appropriately adjusted according to a structure of the polymerizable group-containing polyorganosilsesquioxane intended to be manufactured. For example, the amount of the compound represented by Formula (9) above to be used is, for example, from 55 to 100 mol % and preferably from 65 to 100 mol % relative to the total amount of the hydrolyzable silane compound to be used. The amount of the compound represented by Formula (10) above to be used is, for example, from 0 to 70 mol % relative to the total amount of the hydrolyzable silane compound to be used. The total amount of the compound represented by Formula (9) and the compound represented by Formula (10) to be used relative to the total amount of the hydrolyzable silane compound to be used is, for example, from 60 to 100 mol %, preferably from 70 to 100 mol %, and more preferably from 80 to 100 mol %.

In using two or more hydrolysable silane compounds in the manufacturing of the polymerizable group-containing polyorganosilsesquioxane, the hydrolysis and the condensation reaction for each hydrolyzable silane compound can be performed simultaneously or sequentially.

The hydrolysis and the condensation reaction described above are preferably performed in the presence of one or two or more of solvents. Examples of a preferred solvent include ethers, such as diethyl ether, dimethoxyethane, tetrahydrofuran, and dioxane; and ketones, such as acetone, methyl ethyl ketone, and methyl isobutyl ketone. The amount of the solvent to be used is appropriately adjusted according to the reaction time and the like within a range of, for example, not greater than 2000 parts by mass per 100 parts by mass of the hydrolyzable silane compound.

The hydrolysis and the condensation reaction described above are preferably allowed to proceed in the presence of one or two or more catalysts and water. The catalyst may be an acid catalyst or may be an alkali catalyst. The amount of the catalyst to be used is appropriately adjusted within a range of, for example, 0.002 to 0.2 mol per mol of the hydrolyzable silane compound. The amount of the water to be used is appropriately adjusted within a range from, for example, 0.5 to 20 mol per mol of the hydrolyzable silane compound.

The hydrolysis and the condensation reaction of the hydrolyzable silane compound may be performed in one stage or may be performed in two or more stages. In manufacturing the polymerizable group-containing polyorganosilsesquioxane having a value of the molar ratio (T3 form/T2 form) of not less than 5, the reaction temperature of the hydrolysis and the condensation reaction in the first stage is, for example, from 40 to 100° C. and preferably from 45 to 80° C. The reaction time of the hydrolysis and the condensation reaction in the first stage is, for example, from 0.1 to 10 hours and preferably from 1.5 to 8 hours. The reaction temperature of the hydrolysis and the condensation reaction in the second stage is preferably from 5 to 200° C. and more preferably from 30 to 100° C. Control of the reaction temperature in the above range tends to enable more efficient control of the value of the molar ratio (T3 form/T2 form) and the number average molecular weight in the desired ranges. In addition, the reaction time of the hydrolysis and the condensation reaction in the second stage is not particularly limited but is preferably from 0.5 to 1000 hours and more preferably from 1 to 500 hours. Furthermore, the hydrolysis and the condensation reaction described above can be performed under normal pressure, under increased pressure, or under reduced pressure. The hydrolysis and the condensation reaction described above is preferably performed under an atmosphere of an inert gas, such as nitrogen or argon.

The hydrolysis and the condensation reaction of the hydrolyzable silane compound as described above provide the polymerizable group-containing polyorganosilsesquioxane described above. After the completion of the reaction, the catalyst is preferably neutralized to prevent ring-opening of the polymerizable group.

The polymerizable group-containing polyorganosilsesquioxane thus obtained is purified as necessary.

The adhesive for forming the adhesive layer 4 preferably contains at least one curing catalyst in addition to the polymerizable group-containing polyorganosilsesquioxane, for example, manufactured as described above.

Examples of the curing catalyst when the adhesive for forming the adhesive layer 4 contains an epoxy group-containing polyorganosilsesquioxane include thermal cationic polymerization initiators. Examples of the curing catalyst when the adhesive contains a (meth)acryloyloxy group-containing polyorganosilsesquioxane include thermal radical polymerization initiators. The content of the curing catalyst in the adhesive is preferably from 0.1 to 3.0 parts by mass per 100 parts by mass of the polymerizable group-containing polyorganosilsesquioxane.

Examples of the thermal cationic polymerization initiator described above include various types of thermal cationic polymerization initiators, such as arylsulfonium salts, aluminum chelates, and boron trifluoride amine complexes. Examples of the arylsulfonium salts include hexafluoroantimonate salts. Examples of the aluminum chelates include ethyl acetoacetate aluminum diisopropylate and aluminum tris(ethyl acetoacetate). Examples of the boron trifluoride amine complexes include a boron trifluoride monoethyl amine complex, a boron trifluoride imidazole complex, and a boron trifluoride piperidine complex.

Examples of the thermal radical polymerization initiators described above include thermal radical polymerization initiators of types, such as azo compounds and peroxides. Examples of the azo compounds include 2,2'-azobisisobutyronitrile, 2,2'-azobis(2,4-dimethylvaleronitrile), 2,2'-azobis(4-methoxy-2,4-dimethylvaleronitrile), dimethyl-2,2'-azobis(2-methylpropionate), dimethyl 2,2'-azobis (isobutyrate), diethyl-2,2'-azobis(2-methylpropionate), and dibutyl-2,2'-azobis(2-methylpropionate).

Examples of the peroxides include benzoyl peroxide, t-butyl peroxy-2-ethylhexanoate, 2,5-dimethyl-2,5-di(2-ethylhexanoyl) peroxyhexane, t-butyl peroxybenzoate, t-butyl peroxide, cumene hydroperoxide, dicumyl peroxide, di-t-butyl peroxide, 2,5-dimethyl-2,5-dibutyl peroxyhexane, 2,4-dichlorobenzoyl peroxide, 1,4-di(2-t-butylperoxyisopropyl) benzene, 1,1-bis(t-butylperoxy)-3,3,5-trimethylcyclohexane, methyl ethyl ketone peroxide, and 1,1,3,3-tetramethylbutyl peroxy-2-ethylhexanoate.

The adhesive for forming the adhesive layer 4 may contain one or two or more additional curable compounds in addition to the polymerizable group-containing polyorganosilsesquioxane described above. Examples of the curable compound include epoxy compounds other than the polymerizable group-containing polyorganosilsesquioxane described above, (meth)acryloyloxy group-containing compounds, vinyl group-containing compounds, oxetane compounds, and vinyl ether compounds.

Examples of the epoxy compounds other than the polymerizable group-containing polyorganosilsesquioxane described above include alicyclic epoxy compounds (alicyclic epoxy resins), aromatic epoxy compounds (aromatic epoxy resins), and aliphatic epoxy compounds (aliphatic epoxy resins). Examples of the alicyclic epoxy compounds include 3,4,3',4'-diepoxybicyclohexane, 2,2-bis(3,4-epoxycyclohexyl)propane, 1,2-bis(3,4-epoxycyclohexyl)ethane, 2,3-bis(3,4-epoxycyclohexyl)oxirane, bis(3,4-epoxycyclohexylmethyl)ether, and an 1,2-epoxy-4-(2-oxiranyl)cyclohexane adduct of 2,2-bis(hydroxymethyl)-1-butanol (e.g., "EHPE3150" available from Daicel Corporation).

Examples of the aromatic epoxy compounds include epibis-type glycidyl ether epoxy resins and novolac-alkyl-type glycidyl ether epoxy resins.

Examples of the aliphatic epoxy compounds include glycidyl ethers of a q-hydric alcohol (q is a natural number) having no cyclic structure, glycidyl esters of a monocarboxylic acid or a polycarboxylic acid, and epoxy compounds of fat and oil having a double bond. Examples of the epoxy compounds of fat and oil having a double bond include epoxidized linseed oil, epoxidized soybean oil, and epoxidized castor oil.

Examples of the (meth)acryloyloxy group-containing compounds described above include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl) isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, bis(2-hydroxyethyl) isocyanurate di(meth)acrylate, dicyclopentanyl diacrylate, epoxy acrylate, urethane acrylate, unsaturated polyester, polyester acrylate, polyether acrylate, vinyl acrylate, silicone acrylate, and polystyrylethyl methacrylate. In addition, examples of the (meth)acryloyloxy group-containing compounds described above also include "DA-141" available from Nagase ChemteX Corporation, "Aronix M-211B" and "Aronix M-208" available from Toagosei Co., Ltd., and "NK Ester", "ABE-300", "A-BPE-4", "A-BPE-10", "A-BP E-20", "A-BPE-30", "BPE-100", "BPE-200", "BPE-500", "BPE-900", and "BPE-1300N" available from Shin-Nakamura Chemical Co., Ltd.

Examples of the vinyl group-containing compounds include styrene and divinylbenzene.

Examples of the oxetane compounds include 3,3-bis(vinyloxymethyl)oxetane, 3-ethyl-3-(hydroxymethyl)oxetane, 3-ethyl-3-(2-ethylhexyloxymethyl)oxetane, 3-ethyl-3-(hydroxymethyl)oxetane, 3-ethyl-3-[(phenoxy)methyl]oxetane, 3-ethyl3-(hexyloxymethyl)oxetane, 3-ethyl-3-(chloromethyl)oxetane, and 3,3-bis(chloromethyl)oxetane.

Examples of the vinyl ether compounds include 2-hydroxyethyl vinyl ether, 3-hydroxypropyl vinyl ether, 2-hydroxypropyl vinyl ether, 2-hydroxyisopropyl vinyl ether, 4-hydroxybutyl vinyl ether, 3-hydroxybutyl vinyl ether, 2-hydroxybutyl vinyl ether, 3-hydroxyisobutyl vinyl ether, 2-hydroxyisobutyl vinyl ether, 1-methyl-3-hydroxypropyl vinyl ether, 1-methyl-2-hydroxypropyl vinyl ether, 1-hydroxymethylpropyl vinyl ether, 4-hydroxycyclohexyl vinyl ether, 1,6-hexanediol monovinyl ether, 1,6-hexanediol divinyl ether, 1,8-octanediol divinyl ether, p-xylene glycol monovinyl ether, p-xylene glycol divinyl ether, m-xylene glycol monovinyl ether, m-xylene glycol divinyl ether, o-xylene glycol monovinyl ether, o-xylene glycol divinyl ether, diethylene glycol monovinyl ether, diethylene glycol divinyl ether, triethylene glycol monovinyl ether, and triethylene glycol divinyl ether.

The adhesive for forming the adhesive layer 4 preferably contains a solvent to adjust its coating properties or the like. Examples of the solvent include propylene glycol monomethyl ether acetate, methyl ethyl ketone, methyl isobutyl ketone, cyclohexanone, toluene, xylene, ethyl acetate, butyl acetate, 3-methoxybutyl acetate, methoxypropyl acetate, ethylene glycol monomethyl ether acetate, methanol, ethanol, isopropyl alcohol, 1-butanol, 1-methoxy-2-propanol, 3-methoxybutanol, ethoxyethanol, diisopropyl ether, ethylene glycol dimethyl ether, and tetrahydrofuran.

The adhesive for forming the adhesive layer 4 may further contain an additive of various types, such as a silane coupling agent, an antifoaming agent, an antioxidant, an antiblocking agent, a leveling agent, a surfactant, an extender, an anticorrosive agent, an antistatic agent, and a plasticizer.

With regard to the heat resistance of the adhesive for forming the adhesive layer 4, the pyrolysis temperature of the adhesive is preferably not lower than 200° C., more preferably not lower than 260° C., and more preferably not lower than 300° C. The pyrolysis temperature is a temperature in a curve obtained by thermogravimetric analysis performed using a heat-indicating thermal polymerization simultaneous analyzer. That is, the curve is obtained for a sample to be analyzed by thermogravimetric analysis in a predetermined temperature range and represents temperature dependence in a predetermined temperature range for a sample to be analyzed, and the temperature is indicated by a point of intersection of a tangent to a portion where there is no weight loss or the weight is gradually decreasing at a constant rate at the initial temperature increasing process and a tangent at an inflection point within a portion where a significant weight loss is occurring at the middle temperature increasing process subsequent to the initial temperature increasing process. As the heat-indicating thermal polymerization simultaneous analyzer, for example, "TG-DTA6300 (trade name)" available from Seiko Instruments Inc. can be used.

In the bonding step according to the present method of manufacturing a semiconductor device, the main surface 3a side of the wafer 3 is bonded via the adhesive for forming the adhesive layer 4 as described above to the back surface 1b side of the thinned wafer 1T in the reinforced wafer 1R.

Specifically, first, the adhesive is coated by spin coating on one or both surfaces to be bonded (the main surface 3a of the wafer 3, the back surface 1b of the thinned wafer 1T) to form the adhesive layer 4. FIG. 3(a) illustrates by way of example coating the adhesive for forming the adhesive layer 4 on the main surface 3a of the wafer 3. In addition, prior to the coating of the adhesive, one or both surfaces to be bonded may be treated with a silane coupling agent. Then, the adhesive is dried and solidified by heating. The heating temperature in the heating is, for example, from 50 to 150° C., and the heating time is, for example, from 5 to 120 minutes. The heating temperature may be constant or may be changed stepwise. Then, the surfaces to be bonded are affixed via the adhesive for forming the adhesive layer 4. In this affixing, the pressure is, for example, from 300 to 5000 g/cm$^2$, and the temperature is, for example, from 30 to 200° C. and preferably in a range of not lower than room temperature and not higher than 80° C. Thereafter, the adhesive is cured by heating between the surfaces to be bonded. The heating temperature for curing is, for example, from 30 to 200° C. and preferably from 50 to 190° C. The heating time for curing is, for example, from 5 to 120 minutes. The heating temperature may be constant or may be changed stepwise. The thickness of the adhesive layer after curing the adhesive for forming the adhesive layer 4 is, for example, from 0.5 to 4.5 μm. The above configuration of curing the adhesive at a relatively low temperature in the present bonding step to achieve adhesive bonding is suitable for reducing dimensional change of the adhesive interposed between the wafers during affixing and also suitable for preventing damage to the elements in the wafer as an adherend.

In the present method of manufacturing a semiconductor device, then, as illustrated in FIG. 4(a) and FIG. 4(b), the temporary adhesion by the temporary adhesive layer 2 between the supporting substrate S and the thinned wafer 1T in the reinforced wafer 1R is released to remove the supporting substrate S (removing step).

The removing step preferably includes a softening treatment to soften the temporary adhesive layer 2 at a temperature higher than the softening point ($T_3$) of the polymer described above in the temporary adhesive layer 2, that is, the polymer of the polyvalent vinyl ether compound (A) and the compound (B). The heating temperature of the temporary adhesive layer in this softening treatment is preferably not lower than 170° C., and, for example, not higher than 250° C., preferably not higher than 240° C., and more preferably not higher than 230° C. In the present removing step, for example, after such a softening treatment, the supporting substrate S is slid relative to the thinned wafer 1T, and the supporting substrate S is separated or removed. After removing the reinforced wafer 1R, if the temporary adhesive remains on the thinned wafer 1T, the temporary adhesive is removed. In this removing operation, one or two or more solvents in which the temporary adhesive is readily soluble can be used. Examples of such solvents include cyclohexanone, propylene glycol monomethyl ether, propylene glycol monomethyl ether acetate, acetone, ethyl acetate, butyl acetate, and methyl isobutyl ketone. For the thinned wafer 1T in the reinforced wafer 1R described above not including a wiring structure including an insulating film or a wiring pattern on the main surface 1a side of the thinned wafer 1T, a wiring structure is formed on the main surface 1a side of the thinned wafer 1T after the present removing step. The same applies after the removing step described below.

In the method of manufacturing a semiconductor device of the present embodiment, a predetermined number of the reinforced wafers 1R (illustrated in FIG. 1(a)) are additionally prepared separately from the reinforced wafer 1R described above. As described above, the reinforced wafer 1R has a laminated structure including the wafer 1 having the main surface 1a and the back surface 1b, the supporting substrate S, and the temporary adhesive layer 2 between the wafer 1 and the supporting substrate S. The temporary adhesive layer 2 is formed from the temporary adhesive described above. Then, in each reinforced wafer 1R, the wafer 1 is thinned as illustrated in FIG. 1(b). Specifically, in each reinforced wafer 1R, the wafer 1 in a state of being supported by the supporting substrate S is thinned to a predetermined thickness by grinding from the back surface 1b side of the wafer 1 using a grinder to form a thinned wafer 1T. The thickness of the thinned wafer 1T is, for example, from 1 to 20 μm.

Then, as illustrated in FIG. 5(a) and FIG. 5(b), the man surface 1a side of the thinned wafer 1T laminated on the wafer 3, which is the base wafer, is bonded via the adhesive for forming the adhesive layer 4 described above to the back surface 1b side of the thinned wafer 1T in the additional reinforced wafer 1R (additional bonding step).

Specifically, first, the adhesive for forming the adhesive layer 4 is coated, for example, by spin coating on one or both surfaces to be bonded (the main surface 1a of one thinned wafer 1T, the back surface 1b of the other thinned wafer 1T) to form the adhesive layer 4. FIG. 5(a) illustrates by way of example coating the adhesive for forming the adhesive layer 4 on the main surface 1a of one thinned wafer 1T. In addition, prior to the coating of the adhesive, one or both surfaces to be bonded may be treated with a silane coupling agent. Then, the adhesive is dried and solidified by heating. The heating temperature in the heating is, for example, from 50 to 150° C., and the heating time is, for example, from 5 to 120 minutes. The heating temperature may be constant or may be changed stepwise. Then, the surfaces to be bonded are affixed via the adhesive. In this affixing, the pressure is, for example, from 300 to 5000 g/cm², and the temperature is, for example, from 30 to 200° C. and preferably in a range of not lower than room temperature and not higher than 80° C. Thereafter, the adhesive is cured by heating between the surfaces to be bonded. The heating temperature for curing is, for example, from 30 to 200° C. and preferably from 50 to 190° C., and the heating time for curing is, for example, from 5 to 120 minutes. The heating temperature may be constant or may be changed stepwise. The thickness of the adhesive layer 4 after curing is, for example, from 0.5 to 4.5 μm. The above configuration of curing the adhesive for forming the adhesive layer 4 at a relatively low temperature in the present additional bonding step to achieve adhesive bonding is suitable for reducing dimensional change of the adhesive interposed between the wafers during affixing and also suitable for preventing damage to the elements in the wafer as an adherend.

In the present method of manufacturing a semiconductor device, then, as illustrated in FIG. 6(a) and FIG. 6(b), the temporary adhesion by the temporary adhesive layer 2 between the supporting substrate S and the thinned wafer 1T in the reinforced wafer 1R further laminated is released to remove the supporting substrate S (removing step after the additional bonding). The present removing step after the additional bonding preferably includes a softening treatment to soften the temporary adhesive layer 2 at a temperature higher than the softening point ($T_3$) of the polymer described above in the temporary adhesive layer 2, that is, the polymer of the polyvalent vinyl ether compound (A) and the compound (B). The heating temperature of the temporary adhesive layer in this softening treatment is preferably not lower than 170° C., and, for example, not higher than 250° C., preferably not higher than 240° C., and more preferably not higher than 230° C. In the present removing step after the additional bonding, for example, after such a softening treatment, the supporting substrate S is slid relative to the thinned wafer 1T, and the supporting substrate S is separated or removed. After removing the reinforced wafer 1R, if the temporary adhesive remains on the thinned wafer 1T, the temporary adhesive is removed.

Figure 7:
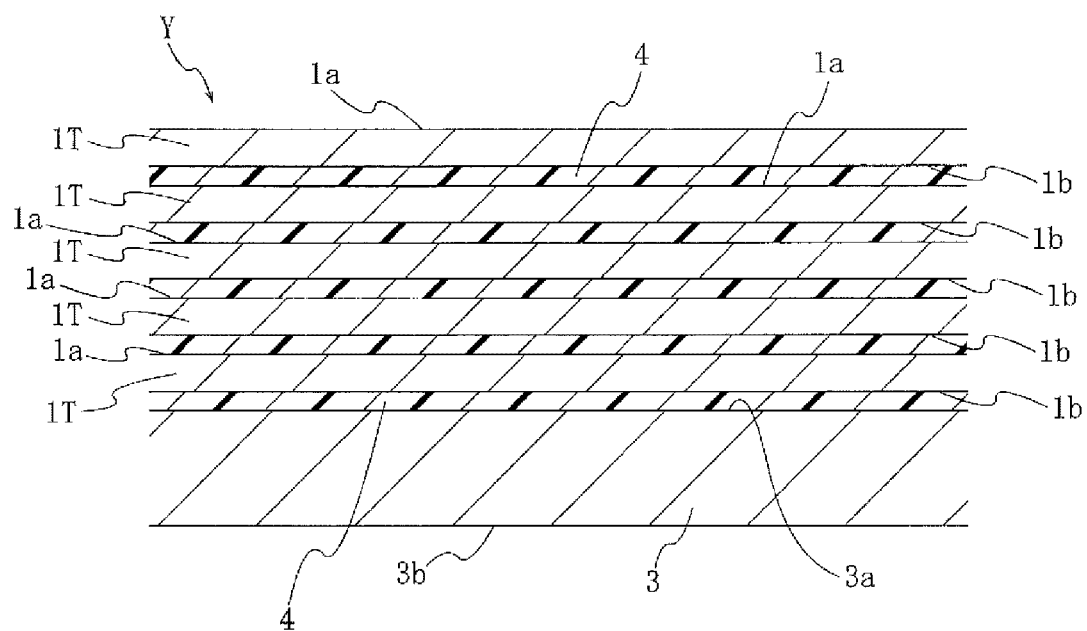
FIG. 7 illustrates some processes in a method of manufacturing a semiconductor device according to an embodiment of the present invention.

In the present method of manufacturing a semiconductor device, a plurality of thinned wafers 1T is sequentially laminated by repeating a series of processes including the thinning step to thin the wafer 1 of the reinforced wafer 1R (FIG. 1), the additional bonding step described above (FIG. 5), and the subsequent removing step (FIG. 6) for each additional reinforced wafer 1R to be prepared, and through electrodes 5 can be formed. FIG. 7 illustrates as an example a wafer laminate Y having a configuration in which five thinned wafers 1T are arranged in multilayers on the wafer 3 and through electrodes 5 are formed. The configuration of forming such through electrodes 5 is suitable for achieving an efficient digital signal processing, for reducing attenuation of the high-frequency signal, and also for reducing power consumption in a semiconductor device to be manufactured.

Figure 8:
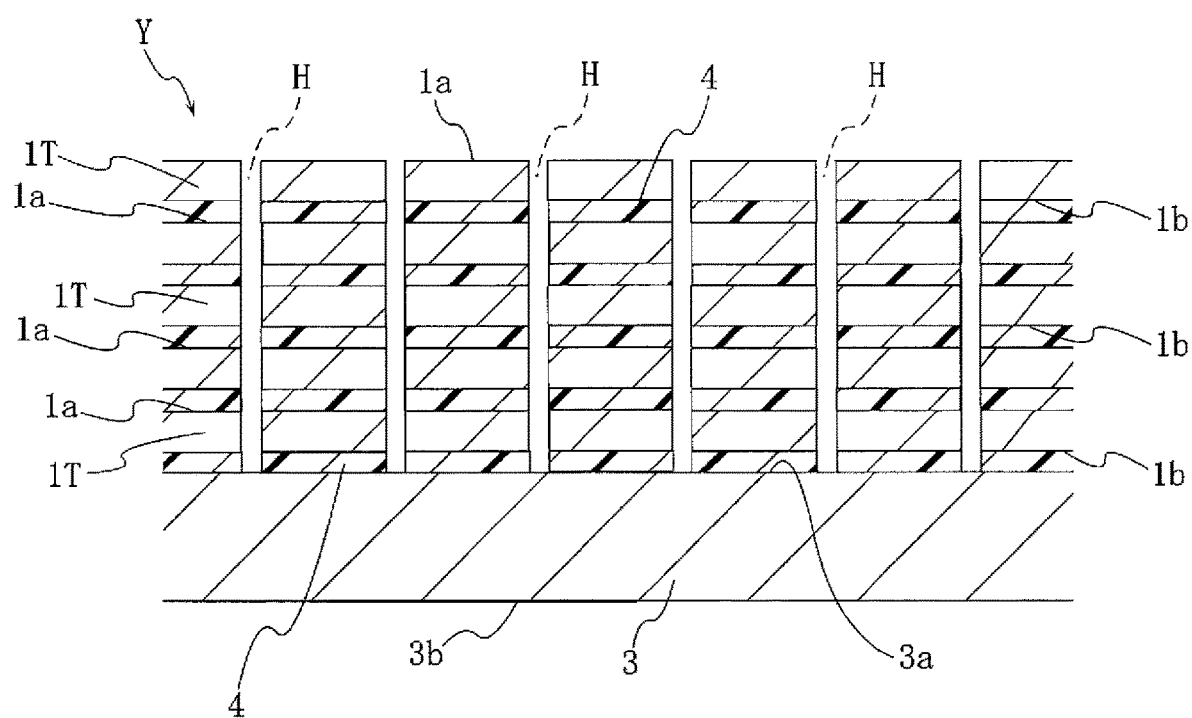
FIG. 8 illustrates some processes in a method of manufacturing a semiconductor device according to an embodiment of the present invention.

In the present method of manufacturing a semiconductor device, then, as illustrated in FIG. 8, holes H as through holes are formed by an etching treatment in the wafer laminate Y including the thinned wafers 1T and the adhesive layers 4 (hole forming step). The hole forming step corresponds to a process to form holes H by an etching treatment from the wafer via a mask pattern masking a portion of the main surface side of the wafer in the wafer laminate, the holes H penetrating wafers and adhesive layers and reaching the wiring pattern of the main surface 3a in the wafer 3. The portions facing the holes H in the wiring pattern (not illustrated) form bottom surfaces of the holes H. Specifically, the hole forming step first forms a resist pattern as an etching mask on an insulating film (not illustrated). This resist pattern has openings for forming holes at locations corresponding to locations where holes are to be formed in the wafer laminate. Then, holes H are formed by an etching treatment from the thinned wafer 1T side via the resist pattern, which is an etching mask, the holes H penetrating the thinned wafers 1T and the adhesive layers 4 and reaching the wiring pattern (not illustrated) in the wafer 3. In this etching treatment, reactive ion etching is performed. In the etching treatment on the thinned wafer 1T, reactive ion etching by Bosch process is preferably performed. As the etching gas in the etching treatment, for example, a mixed gas of $SiF_6$ and Ar can be used. In the etching treatment on the adhesive layer 4, reactive ion etching is preferably performed. As the etching gas in the etching treatment, for example, a mixed gas of $CF_4$, $O_2$, and Ar can be used. The volume ratio of $CF_4$, $O_2$, and Ar in the etching gas is, for example, 100:400:200. The etching treatment on the adhesive layer 4 is performed, for example, under conditions of an atmospheric pressure of 100 mTorr and a high frequency power supply power of 2000 W, and the etching rate of the adhesive layer 4 during the etching treatment is, for example, from 1 to 2 μm/min.

Figure 9:
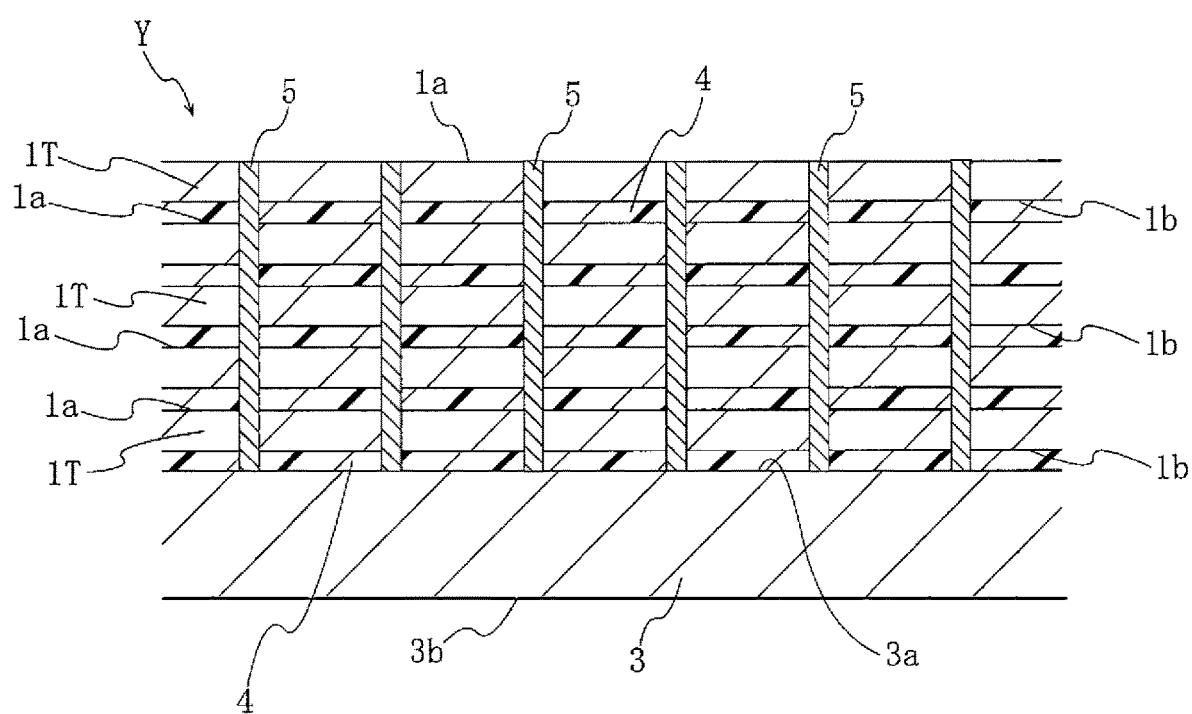
FIG. 9 illustrates some processes in a method of manufacturing a semiconductor device according to an embodiment of the present invention.

Then, as illustrated in FIG. 9, through electrodes 5 are formed (electrode forming step). The through electrodes 5 are for electrically connecting semiconductor elements formed in different wafers in the wafer laminate Y. In the present embodiment, the through electrodes 5 extend through the inside of the wafer laminate from the element forming surface 1a of the thinned wafer 1T located at one end in lamination direction in the wafer laminate and reach the element forming surface 3a of the wafer 3 located at another end in the lamination direction in the wafer laminate. In the present electrode forming step, the through electrodes 5 can be formed, for example, through forming openings penetrating all the thinned wafers 1T and the adhesive layers 4; forming insulating films (not illustrated) on inner wall surfaces of the openings; forming barrier layers (not illustrated) on the insulating film surfaces; forming seed layers for electroplating (not illustrated) on the barrier layer surfaces; and filling the openings with a conductive material, such as copper, by an electroplating method. Examples of the technique for forming the openings include reactive ion etching. In addition, a technique described, for example, in JP 2016-004835 A may be employed to form the through electrodes 5. The through electrodes 5 to be formed electrically connect specifically wiring structures (not illustrated) each formed on the main surface 1a side of each thinned wafer 1T and a wiring structure (not illustrated) formed on the main surface 3a side of the wafer 3 to each other. Such through electrodes 5 can appropriately electrically connect the semiconductor elements at short distances in a semiconductor device to be manufactured. Thus, the configuration of forming such through electrodes 5 is suitable for achieving an efficient digital signal processing, for reducing attenuation of the high-frequency signal, and also for reducing power consumption in a semiconductor device to be manufactured.

Figure 10:
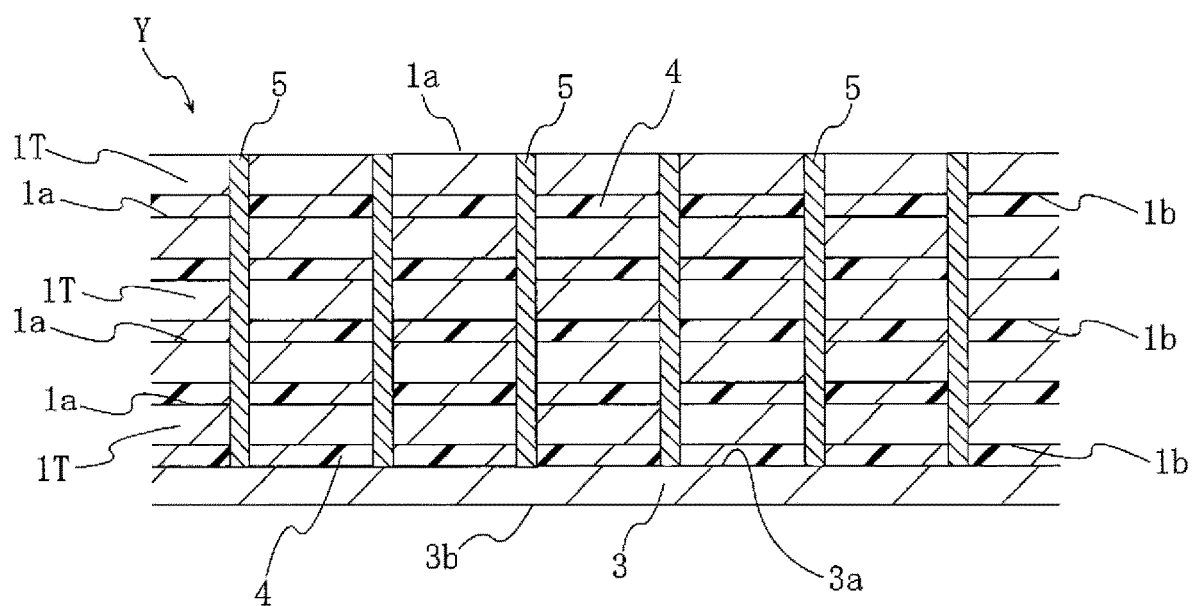
FIG. 10 illustrates some processes in a method of manufacturing a semiconductor device according to an embodiment of the present invention.

In the present method of manufacturing a semiconductor device, then, the wafer 3 (first wafer), which is the base wafer, may be thinned as illustrated in FIG. 10. In the present thinning step, the wafer 3 is thinned to a predetermined thickness, for example, by grinding on the back surface 3b side of the wafer 3. The thickness of the wafer 3 after thinning is, for example, from 5 to 400 µm. Such a configuration is suitable for reducing the thickness of a semiconductor device to be manufactured.

Thereafter, an insulating film (not illustrated) may be formed on the main surface 1a of the thinned wafer 1T laminated last, and an external connection bump (not illustrated) may be formed on the insulating film. Alternatively, a through electrode (not illustrated) extending through the wafer 3 after thinning and electrically connected to a wiring structure (not illustrated) in the main surface 3a side of the wafer 3 may be formed, and an external connection bump (not illustrated) electrically connected to the through electrode may be formed on the back surface 3b side of the wafer 3.

As described above, the semiconductor device having a three-dimensional structure in which semiconductor elements are integrated in their thickness direction can be manufactured. This semiconductor device may be divided into individual pieces by dicing.

The thickness of the adhesive layer 4 in the present method is from 0.5 to 4.5 µm, preferably from 1.0 to 4.0 µm, more preferably from 1.5 to 3.5 µm, and more preferably from 2.0 to 3.0 µm. Such a configuration is suitable for shortening the conductive portion or the through electrode formed in the present method and thus is suitable for reducing the resistance of the entire conductive path or the entire wiring between semiconductor elements electrically connected via the through electrode. In addition, the adhesive layer 4, even thin to this extent, is suitable for exhibiting sufficient wafer bonding strength.

The thickness of the thinned wafer 1T in the present method is from 1 to 20 µm, preferably from 0.5 to 18 µm, and more preferably from 1 to 15 µm. Such a configuration is suitable for shortening the conductive portion or the through electrode formed in the present method and thus is suitable for reducing the resistance of the entire conductive path or the entire wiring between semiconductor elements electrically connected via the through electrode and reducing a variation in the resistance value.

In addition, the wafer and adhesive layer 4 are thin as described above, and this contributes to reducing the size and increasing the density of a semiconductor device to be produced by the present method.

Furthermore, the thinner the adhesive layer 4 is and the faster the etching rate in the etching treatment is, the more easily an etching residue in the holes is reduced at each stage having undergone the hole forming step described above with reference to FIG. 8 or the subsequent process. Reducing the etching residue in the holes contributes to reducing the contact resistance described above and reducing a variation in the resistance value.

Still more, the thinner the adhesive layer 4 and the faster the etching rate in the etching treatment is, the more easily the formation of an undercut or side etching on the surface of the adhesive layer 4, the surface where the hole is exposed, is prevented, and thus the more easily the conductive portion is formed according to the hole in an appropriate shape in the hole forming step described above with reference to FIG. 8. Such a configuration contributes to preventing the formation of leakage current in what is called a conductive portion.

As described above, the present method of manufacturing a semiconductor device includes a bonding step (FIG. 3 and FIG. 5) for wafer-to-wafer bonding with the adhesive for forming the adhesive layer 4, the adhesive containing a polymerizable group-containing polyorganosilsesquioxane. The polymerizable group-containing polyorganosilsesquioxane is suitable for achieving a relatively low polymerization temperature or curing temperature of, for example, approximately 30 to 200° C. and is suitable for achieving high heat resistance after curing. Thus, the wafer-to-wafer adhesive bonding with the adhesive containing the polymerizable group-containing polyorganosilsesquioxane is suitable for achieving high heat resistance in the adhesive layer to be formed between the wafers as well as achieving lower curing temperature for forming the adhesive layer and thus preventing damage to the elements in the wafer 1 as an adherend.

In the present method of manufacturing a semiconductor device, as described above, the wafer 1 (the wafer 1 of the reinforced wafer 1R) affixed to the supporting substrate S via the temporary adhesive layer 2 is thinned and then bonded to the wafer 3, and then the supporting substrate S is removed from the thinned wafer 1T. In addition, as described above, the temporary adhesive for forming the temporary adhesive layer 2 contains a polyvalent vinyl ether compound, a compound having two or more hydroxy groups or carboxy groups that are capable of forming an acetal bond by reacting with a vinyl ether group of the polyvalent vinyl ether compound so as to form a polymer with the polyvalent vinyl ether compound, and a thermoplastic resin. The temporary adhesive thus configured is suitable, in the form of the temporary adhesive layer 2 formed by curing between the supporting substrate S and the wafer 1, for achieving a relatively high softening temperature of, for example, approximately 130 to 250° C. while ensuring high adhesive strength that can withstand the grinding or the like in the thinning step of the wafer 1.

The temporary adhesive layer 2 described above in the reinforced wafer 1R to be subjected to the bonding step (FIG. 3 and FIG. 5) is thus suitable for achieving a relatively high softening temperature, and the adhesive for forming the adhesive layer 4 used in the above bonding step is suitable for achieving a relatively low curing temperature and high heat resistance after curing as described above. This composite configuration in the present embodiment is suitable for performing each bonding step and performing each subsequent removing both in combination. That is, the composite configuration is suitable for performing the bonding at a relatively low temperature condition to achieve a good adhesive bonding of an upper wafer (the thinned wafer 1T) to a lower wafer (the wafer 3 or the thinned wafer 1T) while maintaining the temporary adhesion of the supporting substrate S and the thinned wafer 1T in the reinforced wafer 1R as well as for performing the subsequent removing at a relatively high temperature condition to soften the temporary adhesive layer 2 to remove the supporting substrate S from the thinned wafer 1T while maintaining the wafer-to-wafer adhesive bonding. The configuration of releasing the temporary adhesion by the temporary adhesive layer 2 through softening the temporary adhesive layer 2 in removing the supporting substrate S from the thinned wafer 1T is suitable for avoiding or preventing a strong stress applied locally to the thinned wafer 1T to avoid damage to the thinned wafer 1T.

As described above, the present method of manufacturing a semiconductor device is suitable for achieving low wiring resistance between semiconductor elements to be multilayered in a semiconductor device to be manufactured. Such a method of manufacturing a semiconductor device is suitable for reducing high speed signal transmission at low power consumption in the semiconductor device to be manufactured and is also suitable for reducing attenuation of a high frequency signal.

EXAMPLE

As described below, a total of 71 through electrodes were formed in a given wafer laminate (1).

Example 1

Production of Wafer Laminate (1)

First, a first silicon wafer (a diameter of 300 mm) having a rewiring layer on its surface and a second silicon wafer (a diameter of 300 mm) were prepared. The rewiring layer of the first silicon wafer includes a Cu wiring pattern having a region exposed outside the rewiring layer. Then, the rewiring side of the first silicon wafer and the second silicon wafer were bonded using an adhesive composition (A) described later. Specifically, first, surfaces to be affixed of the first silicon wafer and the second silicon wafer were treated with a silane coupling agent. The silane coupling agent treatment was performed by coating a silane coupling agent ("KBE403 (trade name)" available from Shin-Etsu Chemical Co., Ltd.) on surfaces to be affixed of the first silicon wafer and the second silicon wafer by spin coating and subsequent heating at 120° C. for 5 minutes. Then, the adhesive (A) was coated by spin coating on the silane coupling agent-treated surface of the first silicon wafer, and an adhesive composition layer was formed. Then, the composition layer was dried by heating at 80° C. for 4 minutes and then heating at 100° C. for 2 minutes. An adhesive layer with a thickness of 2.5 μm was thus formed on the rewiring side, which was the surface to be affixed of the first silicon wafer. Then, two wafers were affixed under pressure via the adhesive composition layer formed on one wafer, and then the adhesive composition layer was cured by heating. In the affixing, the pressure is, for example, 1000 g/cm$^2$, and the temperature is 50° C. Upon curing, the adhesive composition layer was heated first at 135° C. for 30 minutes and then heated at 170° C. for 30 minutes. The thickness of the adhesive layer bonding the wafers is 2.5 μm. As described above, a wafer laminate body (1) having a laminated structure including the first and second silicon wafers and the adhesive layer (a thickness of 2.5 μm) bonding the first and second silicon wafers was formed.

Process for Wafer Laminate (1)

The second silicon wafer in the wafer laminate (1) was ground using a grinder ("DGP8761HC (trade name)" available from DISCO Corporation), and the second silicon wafer was thinned to a thickness of 10 μm. Then, a silicon oxide film (insulating film) was formed on the ground surface of the second silicon wafer by a CVD method. Then, a concave portion having a predetermined pattern shape was formed in the insulating film. The concave portion was formed by an etching treatment on the insulating film, in which a predetermined resist pattern was formed on the insulating film by a lithography technique and then the resist pattern was used as an etching mask.

Then, the resist pattern was removed from the insulating film, and then holes (through holes) were formed. Specifically, first, a resist pattern as an etching mask was formed on the insulating film. This resist pattern has openings for forming holes at locations corresponding to locations where holes are to be formed. Then, holes were formed by an etching treatment from the second silicon wafer side via the resist pattern, which was an etching mask, the holes penetrating the second silicon wafer (a thickness of 10 μm) and the adhesive layer (a thickness of 2.5 μm) and reaching the wiring pattern in the first silicon wafer. In this etching treatment, first, a first etching treatment on the second silicon wafer was performed, followed by a second etching treatment on the adhesive layer. In the first etching treatment, an etching apparatus ("Silivia (trade name)" available from Applied Materials, Inc.) was used to perform reactive ion etching by Bosch process, and a mixed gas of $SiF_6$ and Ar was used as the etching gas. In the second etching treatment, an etching apparatus ("e-MAX (trade name)" available from Applied Materials, Inc.) was used to perform reactive ion etching under conditions of an atmospheric pressure of 100 mTorr and a high frequency power supply power of 2000 W, and a mixed gas of $CF_4$, $O_2$, and Ar was used as the etching gas. The volume ratio of $CF_4$, $O_2$, and Ar in this etching gas is, for example, 100:400:200.

Then, silicon oxide films were conformally formed on the inner surfaces of the holes by a CVD method. Then, portions on the bottom surfaces of the holes in the silicon oxide films were etched away. In the etching treatment for the etching away, an etching apparatus ("e-MAX (trade name)" available from Applied Materials, Inc.) was used to perform reactive ion etching, and a mixed gas of $CHF_3$, $CF_4$, and Ar was used as the etching gas.

Then, an oxygen plasma cleaning treatment was performed, followed by a sulfuric acid cleaning treatment and then an argon sputtering cleaning treatment. In the oxygen plasma cleaning treatment, a plasma apparatus ("e-MAX (trade name)" available from Applied Materials, Inc.) and oxygen gas were used under a temperature condition of 120° C. with a plasma ashing (cleaning treatment) time of 15 seconds. In the sulfuric acid cleaning treatment, a cleaning apparatus ("GPTC-1 (trade name)") and a 2 mass % sulfuric acid were used with a cleaning treatment time of 43 seconds. In the argon sputtering cleaning treatment, a sputtering apparatus ("Producer (trade name)" available from Applied Materials, Inc.) was used with an Ar sputtering (cleaning treatment) time of 3 minutes.

Then, Ta barrier layers (a thickness of 80 nm) were formed by a CVD method on the wall surfaces of the holes having undergone the cleaning treatment, and then Cu seed layers (a thickness of 1 μm) for electroplating were conformally formed by a sputtering deposition method. Then, Cu was deposited by electroplating throughout in the holes and in the concave portion included in the insulating film on the second silicon wafer. Then, excess deposition portions of Cu on the second silicon wafer were removed by a CMP method.

By the process described above, through electrodes were formed in the wafer laminate (1), and a wiring pattern was formed in the concave portion of the insulating film on the second silicon wafer of the wafer laminate (1).

Example 2

As described below, a total of 71 through electrodes were formed in a given wafer laminate (2).

Production of Wafer Laminate (2)

First, a first silicon wafer (a diameter of 300 nm) having a rewiring layer on its surface and a reinforced second silicon wafer (a diameter of 300 nm) were prepared.

The rewiring layer of the first silicon wafer includes a Cu wiring pattern having a region exposed outside the rewiring layer.

The reinforced second silicon wafer was produced as follows. First, an adhesive composition for forming a temporary adhesive layer was coated by spin coating on a silicon substrate (a diameter of 300 mm and a thickness of 775 μm) serving as a supporting substrate, and a temporary adhesive composition layer was formed. The composition layer was dried to solidify by heating at 200° C. for 2 minutes and then at 230° C. for 4 minutes, and a temporary adhesive layer was formed. The adhesive composition for forming a temporary adhesive layer was prepared by mixing 0.24 parts by mass of diethylene glycol divinyl ether, 5.4 parts by mass of a p-hydroxystyrene/styrene copolymer ("MARUKA LYNCUR CST-50 (trade name)", a molar ratio of p-hydroxystyrene and styrene of 50:50, a weight average molecular weight of 4400, and a softening point of 150° C., available from Maruzen Petrochemical Co., Ltd.), 1.8 parts by mass of a polyvinyl butyral resin ("S-LEC KS-1 (trade name)", a thermoplastic resin with a molecular weight of $2.7 \times 10^4$ and a softening point of 200° C., available from Sekisui Chemical Co., Ltd.), 1.8 parts by mass of polycaprolactone ("Placcel H1P (trade name)", a thermoplastic resin with a weight average molecular weight of 10000 and a softening point of 100° C., available from Daicel Corporation), 0.18 parts by mass of trans-cinnamic acid (a pKa of 4.44, available from Wako Pure Chemical Industries, Ltd.) as a polymerization accelerator, 0.045 parts by mass of a fluorine oligomer ("F-554 (trade name)" available from DIC Corporation) as a surfactant, and 22 parts by mass of cyclohexane as a solvent. Then, the silicon substrate and the second silicon wafer (a diameter of 300 mm and a thickness of 775 μm) were bonded via the temporary adhesive layer. Specifically, the silicon substrate and the second silicon wafer were affixed via the temporary adhesive layer under pressure under conditions of a temperature of 150° C. and a pressure of 3000 g/cm², and then the silicon substrate and the second silicon wafer were bonded via the temporary adhesive layer through heating at 230° C. for 5 minutes. Then, the second silicon wafer in a state of being supported by the silicon substrate was ground using a grinder (available from DISCO Corporation), and the second silicon wafer was thinned to a thickness of 10 μm. The reinforced second silicon wafer described above was thus produced.

Then, the rewiring side of the first silicon wafer and the reinforced second silicon wafer were bonded using the adhesive composition (A) described later. Specifically, first, surfaces to be affixed of the first silicon wafer and the reinforced second silicon wafer were treated with a silane coupling agent. The silane coupling agent treatment was performed by coating a silane coupling agent ("KBE403 (trade name)" available from Shin-Etsu Chemical Co., Ltd.) on surfaces to be affixed of the first silicon wafer and the reinforced second silicon wafer by spin coating and subsequent heating at 120° C. for 5 minutes. Then, the adhesive (A) was coated by spin coating on the silane coupling agent-treated surface of the first silicon wafer, and an adhesive composition layer was formed. Then, the first silicon wafer having this composition layer was heated at 80° C. for 4 minutes and then heated at 100° C. for 2 minutes to dry the adhesive composition layer, and an adhesive layer with a thickness of 2.5 μm was formed on the first surface of the first silicon wafer. Then, the first silicon wafer having the adhesive layer and the silane coupling agent-treated thinned wafer in the reinforced silicon wafer described above were affixed via the adhesive layer on the first silicon wafer under pressure, followed by heating at 135° C. for 30 minutes and then heating at 170° C. for 30 minutes to cure the adhesive layer, and both silicon wafers were bonded. The affixing was performed under conditions of a temperature of 50° C. and a pressure of 3000 g/cm².

Then, the temporary adhesion by the temporary adhesive layer located between the silicon substrate serving as a supporting substrate and the thinned second silicon wafer was released, and the silicon substrate serving as a supporting substrate was removed from the second silicon wafer. Specifically, after heat treatment at 235° C. for 5 minutes, the silicon substrate was slid at a relative speed of 1 mm/sec relative to the second silicon wafer, and the silicon substrate was removed from the second silicon wafer or the wafer laminate including the second silicon wafer. Thereafter, the temporary adhesive residue on the thinned second silicon wafer was removed by washing using propylene glycol monomethyl ether. As described above, a wafer laminate body (2) having a laminated structure including the first and second silicon wafers and the adhesive layer (a thickness of 2.5 μm) bonding the first and second silicon wafers was formed.

Process for Wafer Laminate (2)

Through electrodes were formed in the wafer laminate (2) and a wiring pattern was formed in the concave portion of the insulating film on the second silicon wafer of the wafer laminate (2) in the same manner as in the process for the wafer laminate (1) with the exception that the wafer laminate (2) was used instead of the second silicon wafer in the wafer laminate (1), the second silicon wafer thinned to a thickness of 10 μm.

Production of Adhesive Composition (A)

The adhesive composition (A) was obtained by mixing 100 parts by mass of an epoxy group-containing polyorganosilsesquioxane obtained as described later, 115 parts by mass of propylene glycol monomethyl ether acetate, 0.45 parts by mass (as a solid content) of an antimony sulfonium salt ("SI-150L (trade name)" available from Sanshin Chemical Industry Co., Ltd.), and 0.05 parts by mass of (4-hydroxyphenyl)dimethylsulfonium methyl sulfite ("SAN-AID SI Auxiliary Agent (trade name)" available from Sanshin Chemical Industry Co., Ltd.).

Synthesis of Polyorganosilsesquioxane

In a 300-mL flask equipped with a reflux condenser, a nitrogen gas inlet tube, a stirrer, and a thermometer, while nitrogen gas was introduced, 161.5 mmol (39.79 g) of 2-(3,4-epoxycyclohexyl)ethyltrimethoxysilane, 9 mmol (1.69 g) of phenyltrimethoxysilane, and 165.9 g of acetone as a solvent were mixed, and the temperature was raised to 50° C. Then, to the mixture, 4.7 g of a 5% potassium carbonate aqueous solution (1.7 mmol as potassium carbonate) was added dropwise over 5 minutes, and then 1700 mmol (30.6 g) of water was added dropwise over 20 minutes. No significant temperature rise occurred in the mixture during the drop-wise addition procedure. After the drop-wise addition procedure, a polycondensation reaction was performed at 50° C. for 4 hours while nitrogen gas was introduced into the flask. A product in the reaction solution after the polycondensation reaction, when analyzed, had a number average molecular weight of 1900 and a molecular weight dispersity of 1.5. In addition, the reaction solution allowed to stand to cool was repeatedly washed with water until a lower layer solution (aqueous phase) generated by a phase separation became neutral, then an upper layer solution was collected. The solvent was distilled off from the upper layer solution under conditions of 1 mmHg and 40° C. until the amount of the solvent became 25 mass %, and a colorless transparent liquid product (epoxy group-containing polyorganosilsesquioxane) was obtained.

Film Thickness and Etching Rate Evaluations

In Examples 1 and 2, the film thickness of the adhesive composition layer produced using the adhesive composition (A) was measured as follows.

First, the adhesive composition (A) was coated by spin coating on a silicon wafer (a diameter of 300 mm and a thickness of 775 μm), and an adhesive composition layer was formed. An amount of the adhesive composition (A) used in one spin coating was 20 g, and the rotation speed of the spin coating was 1200 rpm.

The silicon wafer having this composition layer was heated at 80° C. for 4 minutes and then heated at 100° C. for 2 minutes to dry the adhesive composition layer, and an adhesive layer was formed. Then, the adhesive composition layer on the substrate was heated at 135° C. for 30 minutes and then heated at 170° C. for 30 minutes, and thereby a cured coating was formed on the substrate. The thickness of the formed coating was measured using a fine shape measuring apparatus ("Supplier ET4000A (trade name)" available from Kosaka Laboratory Ltd.). The wafer laminates of Example 1 and Example 2 described above include the cured coating with a thickness of 2.5 μm thus measured as the adhesive layer bonding the first and second silicon wafers.

In addition, the etching rate in the reactive ion etching described above was 1.41 μm/min, the reactive ion etching performed using an etching apparatus ("e-MAX (trade name)" available from Applied Materials, Inc.), that is, dry etching performed using an etching gas containing $CF_4$, $O_2$, and Ar at a volume ratio of 100:400:200 under conditions of an atmospheric pressure of 100 mTorr and a high frequency power supply power of 2000 W.

Shape Observation

The wafer laminates (1) and (2) of Examples 1 and 2 when observed for shapes of the total of 71 through electrodes formed had an amount of bowing of 0.4 μm.

Resistance Value Measurement

The wafer laminates (1) and (2) of Examples 1 and 2 were measured for values of the chain resistance (daisy chain resistance) of the total of 71 through electrodes formed. In the resistance value measurement described above, 99% of measurement points of the through electrodes formed by the methods of Example 1 and Example 2 had a contact resistance of not greater than 150 Q, revealing that low resistance was achieved and the variation was greatly reduced.

Comparative Example 1

Production of Wafer Laminate (3)

A wafer laminate body (3) having a laminated structure including the first and second silicon wafers and the adhesive layer (a thickness of 5 μm) bonding the first and second silicon wafers was formed in the same manner as in Example 1 with the exception that an adhesive composition (B) was used instead of the adhesive composition (A) in the adhesive layer bonding the first and second silicon wafers.

Process for Wafer Laminate (3)

Through electrodes were formed in the wafer laminate (3) and a wiring pattern and through electrodes were formed in the concave portion of the insulating film on the second silicon wafer of the wafer laminate (3) in the same manner as in the process for the wafer laminate (1) with the exception that the wafer laminate (3) was used instead of the wafer laminate (1).

Production of Adhesive Composition (B)

An adhesive composition (B) was obtained by mixing 100 parts by mass of the epoxy group-containing polyorganosilsesquioxane prepared as described above, 50 parts by mass of propylene glycol monomethyl ether acetate, 0.45 parts by mass (as a solid content) of an antimony sulfonium salt ("SI-150L" (trade name)" available from Sanshin Chemical Industry Co., Ltd.), and 0.05 parts by mass of (4-hydroxyphenyl)dimethylsulfonium methyl sulfite ("SAN-AID SI Auxiliary Agent (trade name)" available from Sanshin Chemical Industry Co., Ltd.).

Film Thickness Measurement

In Comparative Example 1, the film thickness of the adhesive composition layer was measured in the same manner as in Examples 1 and 2 with the exception that the adhesive composition (B) was used instead of the adhesive composition (A). The wafer laminates of Comparative Example 1 include the cured coating with a thickness of 5 μm thus measured as the adhesive layer bonding the first and second silicon wafers.

Shape Observation

The wafer laminate (3) of Comparative Example 1 when observed for shapes of the total of 71 through electrodes formed had an amount of bowing of not less than 1 μm.

Resistance Value Measurement

In Comparative Example 1, values of the chain resistance (daisy chain resistance) of the total of 71 through electrodes formed were measured in the same manner as in Examples 1 and 2 with the exception that the wafer laminate (3) was used instead of the wafer laminates (1) and (2) of Examples 1 and 2. As a result, a variation in the resistance value was greater than those of Examples 1 and 2.

Variations of the present invention described above are described below.

(1) A method of manufacturing a semiconductor device, the method including:

preparing a wafer laminate having a laminated structure, the laminated structure including at least a first wafer having an element forming surface including a wiring pattern, a second wafer with a thickness from 1 to 20 μm having a main surface and a back surface opposite from the main surface, and an adhesive layer with a thickness from 0.5 to 4.5 μm in interposed between the element forming surface of the first wafer and the back surface of the second wafer;

hole forming to form a hole extending inside the wafer laminate and reaching the wiring pattern of the first wafer by an etching treatment from the second wafer side via a mask pattern masking a portion of the main surface side of the second wafer in the wafer laminate; and electrode forming to form a through electrode by filling the hole with a conductive material;

wherein the adhesive layer has an etching rate of 1 to 2 μm/min in dry etching performed using an etching gas containing $CF_4$, $O_2$, and Ar at a volume ratio of 100:400:200 under conditions of an atmospheric pressure of 100 mTorr and a high frequency power supply power of 2000 W.

(2) The method of manufacturing a semiconductor device according to (1) above, wherein the thickness of the second wafer is from 0.5 to 18 μm (preferably from 1 to 15 μm).

(3) The method of manufacturing a semiconductor device according to (1) or (2) above, wherein the etching rate is from 1.1 to 1.9 μm/min (preferably from 1.2 to 1.8 μm/min and more preferably from 1.3 to 1.7 μm/min).

(4) The method of manufacturing a semiconductor device according to any one of (1) to (3) above, wherein the thickness of the adhesive layer is from 1.0 to 4.0 μm (preferably from 1.5 to 3.5 μm and more preferably from 2.0 to 3.0 μm).

(5) The method of manufacturing a semiconductor device according to any one of (1) to (4) above, wherein the preparing includes:

forming a reinforced wafer having a laminated structure, the laminated structure comprising a second wafer including a main surface and a back surface opposite from the main surface, a supporting substrate, and a temporary adhesive layer located between the main surface side of the second wafer and the supporting substrate;

thinning the second wafer by grinding the second wafer in the reinforced wafer from the back surface side of the second wafer;

bonding via an adhesive for forming the adhesive layer the element forming surface side of the first wafer to the back surface side of the second wafer of the reinforced wafer, the second wafer having undergone the thinning step; and removing the supporting substrate by releasing a temporary adhesion by the temporary adhesive layer located between the supporting substrate and the second wafer in the reinforced wafer having undergone the bonding step.

(6) The method of manufacturing a semiconductor device according to (5) above, wherein the preparing further includes:

forming at least one additional reinforced wafer having a laminated structure, the laminated structure comprising a second wafer including a main surface and a back surface opposite from the main surface, a supporting substrate, and a temporary adhesive layer located between the main surface side of the second wafer and the supporting substrate;

additional thinning to thin a second wafer in each of the at least one additional reinforced wafer by grinding the second wafer from the back surface side of the second wafer;

at least one additional bonding to bond via the adhesive for forming the adhesive layer the back surface side of the second wafer in the additional reinforced wafer, the second wafer having undergone the additional thinning step, to the main surface side of the second wafer on the first wafer; and at least one removing performed for each of the at least one additional bonding to remove the supporting substrate by releasing a temporary adhesion by the temporary adhesive located layer between the supporting substrate and the second wafer in the additional reinforced wafer.

(7) The method of manufacturing a semiconductor device according to (6) above, wherein the hole forming and the electrode forming are performed on a second wafer and an adhesive layer under the second wafer each time the second wafer is laminated.

(8) The method of manufacturing a semiconductor device according to (6) above, wherein the hole forming and the electrode forming are collectively performed in a wafer laminate including the first wafer and a plurality of second wafers in a laminated structure. (9) The method of manufacturing a semiconductor device according to any one of (5) to (8) above, wherein a temporary adhesive for forming the temporary adhesive layer contains a polyvalent vinyl ether compound (A), a compound (A) having two or more hydroxy groups or carboxy groups capable of forming an acetal bond by reacting with a vinyl ether group of the polyvalent vinyl ether compound and thus capable of forming a polymer with the polyvalent vinyl ether compound, and a thermoplastic resin (C).

(10) The method of manufacturing a semiconductor device according to (9) above, wherein the bonding includes a curing treatment to cure the adhesive at a temperature lower than a softening point of the polymer, and the removing includes a softening treatment to soften the temporary adhesive layer at a temperature higher than the softening point of the polymer.

(11) The method of manufacturing a semiconductor device according to (9) or (10) above, wherein the polyvalent vinyl ether compound (A) is a compound represented by Formula (a) below:

[Chem. 16]

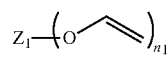

(a)

wherein, in Formula (a), $Z_1$ represents a group in which $n_1$ hydrogen atoms are removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group; and $n_1$ is an integer of 2 or greater (e.g., an integer from 2 to 5 and preferably an integer of 2 or 3).

(12) The method of manufacturing a semiconductor device according to any one of (9) to (11) above, wherein the polyvalent vinyl ether compound (A) is at least one compound selected from the group consisting of 1,4-butanediol divinyl ether, diethylene glycol divinyl ether, and triethylene glycol divinyl ether.

(13) The method of manufacturing a semiconductor device according to any one of (9) to (12) above, wherein the compound (B) is a compound having two or more constituent units (repeating units) represented by Formula (b) below:

[Chem. 17]

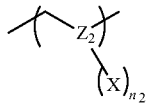
(b)

wherein, in Formula (b), X represents a hydroxy group or a carboxy group; $n_2$ X's may be identical or different from each other. nz represents an integer of 1 or greater (preferably an integer of 1 to 3 and more preferably an integer of 1 to 2); and $Z_2$ represents a group in which $(n_2+2)$ hydrogen atoms are removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group.

(14) The method of manufacturing a semiconductor device according to any one of (9) to (13) above, wherein the compound (B) is a compound having two or more of at least one type of constituent unit (repeating unit) selected from the group consisting of Formulas (b-1) to (b-6) below:

[Chem. 18]

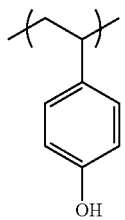
(b-1)

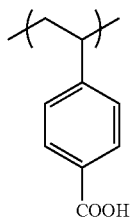
(b-2)

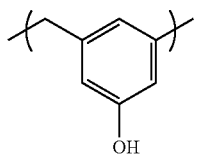
(b-3)

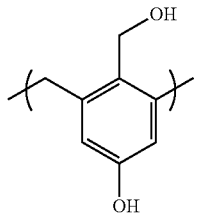
(b-4)

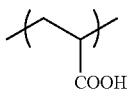
(b-5)

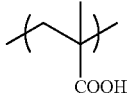
(b-6)

(15) The method of manufacturing a semiconductor device according to any one of (9) to (14) above, wherein a softening point $(T_1)$ of the compound (B) is not lower than 50° C. (preferably not lower than 80° C. and more preferably not lower than 100° C.) and not higher than 250° C. (preferably not higher than 200° C. and more preferably not higher than 150° C.).

(16) The method of manufacturing a semiconductor device according to any one of (9) to (15) above, wherein weight average molecular weight of the compound (B) is not lower than 1500 (preferably from 1800 to 10000 and more preferably from 2000 to 5000).

(17) The method of manufacturing a semiconductor device according to any one of (9) to (16) above, wherein the thermoplastic resin (C) is at least one selected from the group consisting of polyvinyl acetal resins, polyester resins, polyurethane resins, and polyamide resins.

(18) The method of manufacturing a semiconductor device according to any one of (9) to (17) above, wherein weight average molecular weight of the thermoplastic resin (C) is from 1500 to 100000 (preferably from 2000 to 80000, more preferably from 3000 to 50000, more preferably from 10000 to 45000, and more preferably from 15000 to 35000).

(19) The method of manufacturing a semiconductor device according to any one of (9) to (18) above, wherein a difference between a softening point (T3) of the polymer of the polyvalent vinyl ether compound (A) and the compound (B) and a heat curing temperature of the adhesive layer is from 10 to 40° C. (preferably from 20 to 30° C.).

(20) The method of manufacturing a semiconductor device according to any one of (9) to (19) above, wherein content of the polyvalent vinyl ether compound (A) is in an amount corresponding to an amount of vinyl ether groups in the polyvalent vinyl ether compound (A) of 0.01 to 10 mol (preferably an amount of 0.05 to 5 mol, more preferably of 0.07 to 1 mol, and more preferably of 0.08 to 0.5) relative to a total amount of 1 mol of hydroxy groups and carboxy groups in the compound (B).

(21) The method of manufacturing a semiconductor device according to any one of (9) to (20) above, wherein content of the thermoplastic resin (C) is from 0.1 to 3 parts by mass (preferably from 0.2 to 2 parts by mass and more preferably from 0.3 to 1 part by mass) relative to 1 part by mass of the compound (B).

(22) The method of manufacturing a semiconductor device according to any one of (9) to (21) above, wherein total content of the polyvalent vinyl ether compound (A), the compound (B), and the thermoplastic resin (C) is from 70 to 99.9 mass % (preferably from 80 to 99 mass %, more preferably from 85 to 95 mass %, and more preferably from 85 to 90 mass %) of total non-volatile content of the temporary adhesive.

(23) The method of manufacturing a semiconductor device according to any one of (9) to (22) above, wherein the temporary adhesive further contains a polymerization accelerator.

(24) The method of manufacturing a semiconductor device according (23) above, wherein content of the polymerization accelerator is, for example, from 0.01 to 5 parts by mass, preferably from 0.1 to 3 parts by mass, and more preferably from 0.3 to 1 part by mass relative to 1 part by mass of the polyvalent vinyl ether compound (A) contained in the temporary adhesive.

(25) The method of manufacturing a semiconductor device according to any one of (9) to (24) above, wherein the temporary adhesive further contains an antioxidant.

(26) The method of manufacturing a semiconductor device according to (25) above, wherein content of the antioxidant is from 0.01 to 15 parts by mass (preferably from 0.1 to 12 parts by mass and more preferably from 0.5 to 10 parts by mass) relative to 100 parts by mass of the compound (B) and the thermoplastic resin (C).

(27) The method of manufacturing a semiconductor device according to any one of (1) to (26) above, wherein the adhesive contains a polymerizable group-containing polyorganosilsesquioxane.

(28) The method of manufacturing a semiconductor device according to (27) above, wherein a content ratio of the polymerizable group-containing polyorganosilsesquioxane in the adhesive is not less than 70 mass % (from 80 to 99.8 mass % and more preferably from 90 to 99.5 mass %).

(29) The method of manufacturing a semiconductor device according to (27) or (28) above, wherein the polymerizable group-containing polyorganosilsesquioxane contains, as constituent units, $[RSiO_{3/2}]$ (hereinafter referred to as "T3 form") and $[RSiO_{2/2}(OR')]$ (hereinafter referred to as "T2 form"):

wherein R represents a group containing an epoxy group, a group containing a (meth)acryloyloxy group, a hydrogen atom, a substituted or unsubstituted alkyl group, a substituted or unsubstituted alkenyl group, a substituted or unsubstituted cycloalkyl group, a substituted or unsubstituted aryl group, or a substituted or unsubstituted aralkyl group; and R' represents a hydrogen atom or an alkyl group having from 1 to 4 carbon atoms.

(30) The method of manufacturing a semiconductor device according to (29) above, wherein, in all the siloxane constituent units of the polymerizable group-containing polyorganosilsesquioxane, a value of molar ratio of the T3 form to the T2 form (T3 form/T2 form) is from 5 to 500 (a lower limit is preferably 10, and an upper limit is preferably 100 and more preferably 50).

(31) The method of manufacturing a semiconductor device according to any one of (27) to (30) above, wherein number average molecular weight (Mn) of the polymerizable group-containing polyorganosilsesquioxane is from 1000 to 50000 (preferably from 1500 to 10000, more preferably from 2000 to 8000, and more preferably from 2000 to 7000).

(32) The method of manufacturing a semiconductor device according to any one of (27) to (31), wherein molecular weight dispersity (Mw/Mn) of the polymerizable group-containing polyorganosilsesquioxane is from 1.0 to 4.0 (preferably from 1.1 to 3.0 and more preferably from 1.2 to 2.7).

(33) The method of manufacturing a semiconductor device according to any one of (1) to (32) above, the method further including thinning the first wafer by grinding on the back surface side opposite from the element forming surface in the first wafer.

INDUSTRIAL APPLICABILITY

The method of manufacturing a semiconductor device of the present invention can be suitably used for manufacturing a multilayered semiconductor device in which low wiring resistance is achieved and a variation in the resistance value is reduced.

REFERENCE SIGNS LIST

S Supporting substrate
1 Wafer
1T Thinned wafer
1a, 3a Main surface
1b, 3b Back surface
1 R Reinforced wafer
3 Wafer (base wafer)
2 Temporary adhesive layer
4 Adhesive layer
5 Through electrode
Y Wafer laminate
H Hole

The invention claimed is:

1. A method of manufacturing a semiconductor device, the method comprising:

preparing a wafer laminate having a laminated structure, the laminate structure comprising at least a first wafer including an element forming surface having a wiring pattern, a second wafer with a thickness from 1 to 20 μm having a main surface and a back surface opposite from the main surface, and an adhesive layer which contains a polymerizable group-containing polyorganosilsesquioxane with a thickness from 0.5 to 4.5 μm interposed between the element forming surface of the first wafer and the back surface of the second wafer;

hole forming to form a hole extending inside the wafer laminate and reaching the wiring pattern of the first wafer by an etching treatment from the second wafer side via a mask pattern masking a portion of the main surface side of the second wafer in the wafer laminate; and electrode forming to form a through electrode by filling the hole with a conductive material;

wherein the adhesive layer has an etching rate of 1 to 2 μm/min in dry etching performed using an etching gas comprising $CF_4$, $O_2$, and Ar at a volume ratio of 100:400:200 under conditions of an atmospheric pressure of 100 mTorr and a high frequency power supply power of 2000 W.

2. The method of manufacturing a semiconductor device according to claim 1, wherein the wafer laminate is prepared by the following steps:

forming a reinforced wafer having a laminated structure comprising the second wafer including a main surface and a back surface opposite from the main surface, a supporting substrate, and a temporary adhesive layer located between the main surface side of the second wafer and the supporting substrate;

thinning the second wafer by grinding the second wafer in the reinforced wafer from the back surface side of the second wafer, so that the second wafer has the thickness from 1 to 20 μm;

bonding, via an adhesive for forming the adhesive layer, the element forming surface side of the first wafer to the back surface side of the second wafer in the reinforced wafer that has undergone the thinning step; and removing the supporting substrate, which is temporally attached to the second wafer via the temporary adhesive layer, from the second wafer in the reinforced wafer that has undergone the bonding step, so that the wafer laminate is obtained.

3. The method of manufacturing a semiconductor device according to claim 2, wherein a plurality of the wafer laminates are prepared by repeating the steps of forming, thinning, bonding, and removing.

4. The method of manufacturing a semiconductor device according to claim 1, the method further comprising thinning the first wafer by grinding on the back surface side opposite from the element forming surface in the first wafer.

5. A method of manufacturing a semiconductor device comprising:

- forming a reinforced wafer having a laminated structure, the laminated structure comprising a second wafer including a main surface and a back surface opposite from the main surface, a supporting substrate, and a temporary adhesive layer located between the main surface side of the second wafer and the supporting substrate;
- thinning the second wafer by grinding the second wafer in the reinforced wafer from the back surface of the second wafer, so that the second wafer has a thickness from 1 to 20 µm;
- bonding, via an adhesive, an element forming surface having a wiring pattern of a first wafer to the back surface side of the second wafer in the reinforced wafer that has undergone the thinning step, so that the adhesive forms an adhesive layer between the first wafer and the second wafer; and
- removing the supporting substrate, which is temporally attached to the second wafer via the temporary adhesive layer, from the second wafer in the reinforced wafer that has undergone the bonding step, so as to obtain a wafer laminate having a laminated structure comprising the first wafer including the element forming surface having the wiring pattern, the second wafer with the thickness from 1 to 20 µm, and the adhesive layer with a thickness from 0.5 to 4.5 µm interposed between the element forming surface of the first wafer and the back surface of the second wafer;
- hole forming to form a hole extending inside the wafer laminate and reaching the wiring pattern of the first wafer by an etching treatment from the second wafer side via a mask pattern masking a portion of the main surface side of the second wafer in the wafer laminate; and
- electrode forming to form a through electrode by filling the hole with a conductive material;
- wherein the adhesive layer has an etching rate of 1 to 2 µm/min in dry etching performed using an etching gas comprising $CF_4$, $O_2$, and Ar at a volume ratio of 100:400:200 under conditions of an atmospheric pressure of 100 mTorr and a high frequency power supply power of 2000 W; and
- a temporary adhesive for forming the temporary adhesive layer contains a polyvalent vinyl ether compound, a compound comprising two or more hydroxy groups or carboxy groups capable of forming an acetal bond by reacting with a vinyl ether group of the polyvalent vinyl ether compound and thus capable of forming a polymer with the polyvalent vinyl ether compound, and a thermoplastic resin.

6. The method of manufacturing a semiconductor device according to claim 5, wherein the bonding comprises a curing treatment to cure the adhesive at a temperature lower than a softening point of the polymer, and the removing comprises a softening treatment to soften the temporary adhesive layer at a temperature higher than the softening point of the polymer.

* * * * *